United States Patent
Takemura et al.

(10) Patent No.: US 6,717,835 B2
(45) Date of Patent: Apr. 6, 2004

(54) SEMICONDUCTOR DEVICE

(75) Inventors: Riichiro Takemura, Tokyo (JP); Kiyoo Itoh, Higashikurume (JP); Tomonori Sekiguchi, Kokubunji (JP); Takeshi Sakata, Hino (JP); Katsutaka Kimura, Akishima (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/347,804

(22) Filed: Jan. 22, 2003

(65) Prior Publication Data

US 2003/0137863 A1 Jul. 24, 2003

Related U.S. Application Data

(63) Continuation of application No. 10/251,772, filed on Sep. 23, 2002, now Pat. No. 6,535,415, which is a continuation of application No. 09/914,028, filed as application No. PCT/JP00/00698 on Feb. 9, 2000, now abandoned.

(30) Foreign Application Priority Data

Feb. 22, 1999 (JP) ............................. 11-042666

(51) Int. Cl.$^7$ ................................ G11C 5/06
(52) U.S. Cl. .................... 365/63; 365/205; 365/207; 365/226
(58) Field of Search ................ 365/63, 205, 207, 365/189.01, 203, 185.25, 226

(56) References Cited

U.S. PATENT DOCUMENTS

| | | | |
|---|---|---|---|
| 5,325,336 A | 6/1994 | Tomishima et al. | 365/207 |
| 5,375,095 A | 12/1994 | Yamada et al. | 365/230 |
| 5,412,605 A | 5/1995 | Ooishi | 365/203 |
| 5,801,576 A | 9/1998 | Ooishi | 327/530 |
| 5,867,440 A | 2/1999 | Hidaka | 365/226 |
| 5,900,665 A | 5/1999 | Tobita | 257/357 |
| 5,949,729 A * | 9/1999 | Suyama et al. | 365/207 |
| 6,014,337 A | 1/2000 | Makino | 365/205 |
| 6,097,623 A * | 8/2000 | Sakata et al. | 365/145 |

FOREIGN PATENT DOCUMENTS

| | | |
|---|---|---|
| JP | 63-211191 | 9/1988 |
| JP | 4-212454 | 8/1992 |
| JP | 5-62461 | 3/1993 |

(List continued on next page.)

OTHER PUBLICATIONS

K. Ito, Baihuukan, VLSI Memory, 1$^{st}$ issue, Nov. 5, 1994, pp. 161–167.

Yamada et al., "A 64Mb Dram with Meshed Power Line and Distributed Sense–Amplifier Driver,"ISSCC91 Digest of Technical Papers 1991, pp. 108–109.

(List continued on next page.)

*Primary Examiner*—Richard Elms
*Assistant Examiner*—Toan Le
(74) *Attorney, Agent, or Firm*—Miles & Stockbridge P.C.

(57) ABSTRACT

A sense amplifier capable of performing high-speed data sense operation with lower power consumption using a minuscule signal from a memory cell even in a case where a memory array voltage is reduced. A plurality of drive switches for over-driving are distributively arranged in a sense amplifier area, and a plurality of drive switches for restore operation are concentratively disposed at one end of a row of the sense amplifiers. A potential for over-driving is supplied using a meshed power line circuit. Through the use of the drive switches for over-driving, initial sense operation can be performed on data line pairs with a voltage having an amplitude larger than a data-line amplitude, allowing implementation of high-speed sense operation. The distributed arrangement of the drive switched for over-driving makes it possible to dispersively supply current in sense operation, thereby reducing a difference in sense voltage with respect to far and near positions of the sense amplifiers.

6 Claims, 26 Drawing Sheets

FOREIGN PATENT DOCUMENTS

| | | |
|---|---|---|
| JP | 6-309872 | 11/1994 |
| JP | 8-138381 | 5/1996 |
| JP | 9-55482 | 2/1997 |
| JP | WO97/24729 | 7/1997 |
| JP | 9-204777 | 8/1997 |
| JP | 10-269772 | 10/1998 |
| JP | 10-275466 | 10/1998 |
| JP | 11-149768 | 6/1999 |
| JP | 11-297071 | 10/1999 |
| JP | 2000-58785 | 2/2000 |

OTHER PUBLICATIONS

Hidaka, "A 34-ns 16Mb Dram with Controllable Voltage Down-Converter,"IEEE Journal of Solid State Circuits, vol. 27, No. 7, 1982, pp. 1020–1027.

Eto et al., "A 1Gb SDRAM with Ground Level Prechared Bitline and Non–Boosted 2.1V Word Line,"ISSCC98 Digest of Technical Papers, 1998, pp. 82–83.

* cited by examiner (a)

(b)

(a)

(b)

(a)

(b)

SEMICONDUCTOR DEVICE

CROSS-REFERENCE TO RELATED APPLICATIONS

This application is a continuation of application Ser. No. 10/251,772 filed Sep. 23, 2002, now, U.S. Pat. No. 6,535,415 which is a continuation of application Ser. No. 09/914,028 filed Aug. 22, 2001, now abandoned, which is the U.S. National Stage of PCT/JP00/00698 filed Feb. 9, 2000.

TECHNICAL FIELD

The present invention relates to a semiconductor device, and more particularly to a circuit for performing differential amplification therein.

BACKGROUND ART

In this specification, the following technical references are-cited, and document numbers given thereto are hereinafter used for the sake of simplicity. [Document 1]: Japanese Unexamined Patent Publication No. 6 (1994)-309872 (corresponding to U.S. Pat. No. 5,412,605); [Document 2]: VLSI Memory, pp. 161–167, K. Ito, Baihuukan, 1st Issue, Nov. 5, 1994; [Document 3]: T. Yamada, et al., ISSCC91 Dig. Tech. Papers, pp. 108–109, 1991; [Document 4]: H. Hidaka, et al., IEEE Journal of Solid State Circuit, Vol 27, No. 7, (1992), pp. 1020–1027; [Document 5]: Japanese Unexamined Patent Publication No. 63 (1988)-211191; [Document 6]: S. Eto, et al., ISSCC98 Dig. Tech. Papers, pp. 82–83, 1998.

In [Document 1], there is disclosed a technique of stabilizing sense amplifier operation under condition of a reduced power supply voltage in a DRAM by applying a voltage having a potential difference with respect to a final amplification voltage such as GND (e.g., a negative voltage lower than GND) to a source node of a CMOS sense amplifier. This technique is referred to as an "over-driving" scheme since there is provided a time interval during which the sense amplifier is driven by the voltage having a potential difference with respect to the final amplification voltage on a bit line.

[Document 2] is mainly concerned with the technologies of dynamic random access memories (DRAMs), and on pages 161 to 167 thereof, a sense circuit for amplifying a minuscule signal supplied from a memory cell is explained. In particular, pages 163 and 164 describe a method of driving a plurality of sense amplifiers at high speed, under the section title of "(2) Current-Distribution-Type Sense Amplifier Driving." More specifically, according to this method, a sense amplifier driving power voltage (equal to a final amplification voltage on a data line) is supplied in a meshed wiring arrangement, and a plurality of sense amplifiers are driven through one of driving MOSFETs disposed distributively (e.g., four sense amplifiers are driven through one driving MOSFET). [Document 3] and [Document 4] are cited in [Document 2] as the original technical literature proposing the above-mentioned method.

For the purpose of making it possible to implement an over-driving circuit for a large-capacity DRAM to be operated on a low power supply voltage, the inventors have examined some aspects of practicable arrangements of a sense amplifier and an over-driving drive circuit therefor in the DRAM prior to preparing this patent application.

FIG. 25 shows an essential circuit part of the DRAM containing an over-driving drive circuit which has been examined by the inventors prior to preparation of this patent application. The over-driving drive circuit is designed to over-drive a P-side common source line CSP using a voltage VDH higher than a high-level voltage "H" on a data line (VDL). In the over-driving drive circuit, an over-driving voltage VDH is supplied from a terminal of the P-side common source line CSP through a PMOS transistor QDP1 located thereat. In consideration of addition of the over-driving circuit, it is desirable to provide the over-driving drive circuit at a terminal of the CSP line as in the above-stated arrangement for reduction in circuit area.

FIG. 26 shows operating waveforms appearing on the common source line and data line in sense amplifier operation. It is herein assumed that the data line and common source line are precharged with VDL/2 before a sense amplifier starts amplification. Under condition that SP1 is set to a low level to put QDP1 into conduction and the common source line CSP is supplied with the VDH, there are located SAn at the nearest position to a VDH supply node and SA1 at the farthest position therefrom. An over-driving time period Tod representing a duration for which the QDP1 is put into conduction is set so that the "H" level side of the data line will reach the VDL at high speed, not exceeding the VDL.

FIG. 26($a$) shows a case where the Tod is optimized with respect to the SAn which is located at the nearest position to a sense driver corresponding to the VDH supply node, and FIG. 26($b$) shows a case where the Tod is optimized with respect to the SA1 which is located at the farthest position therefrom. As shown in FIG. 26($a$), where the Tod is optimized with respect to the nearest position, a voltage drop occurs on the common source line due to a current supplied from the common source line to each SA in the initial period of sense operation. On the other hand, at the farthest position, an OFF state takes place before a sufficiently high level of voltage (CSP (1)) is not reached, resulting in a sufficiently high effective gate voltage not being attained as required. That is to say, data lines (D1$t$, D1$b$) are put in a low-speed operation state. By way of contrast, as shown in FIG. 26($b$), where the Tod is optimized with respect to the farthest position (SA1), the effect of over-driving becomes too high at the nearest position, causing a data line voltage to exceed the VDL. This results in an increase in power consumption. As mentioned above, the inventors have found that a voltage drop due to resistance on a common source line causes a decrease in sense operation speed or an increase in power consumption, depending on the position of each sense amplifier.

While a current concentration to a common source line of sense amplifiers and an effect on voltage attained thereby are discussed in [Document 2] to [Document 4], no consideration is given to application to an over-driving circuit for the sense amplifiers therein.

It is therefore an object of the present invention to provide a semiconductor device in which non-uniformity in over-driving among a plurality of sense amplifiers is eliminated. Another object of the present invention is to provide a semiconductor device in which an increase in layout area including a plurality of sense amplifiers is reduced while eliminating non-uniformity in over-driving.

DISCLOSURE OF THE INVENTION

In accordance with a typical aspect of the present invention, a plurality of drive switches for over-driving are distributively disposed along a row of sense amplifiers and a plurality of drive switches for restore operation are concentratively provided at one end of the row of sense amplifiers. A potential for over-driving is preferably supplied using a meshed power line circuit.

According to another aspect of the present invention, a plurality of high-side drive switches for a plurality of sense amplifiers are structured using MISFETs of the same conduction type as that of low-side drive switches for common use of a gate signal. This makes it possible to reduce a distributed-arrangement layout area including the drive switches and sense amplifiers.

Further, where MISFETs having a low threshold voltage are used as the sense amplifiers, it is preferable to control a common source node potential of the sense amplifiers for decreasing a leak current in an active-standby state. An impedance-variable sense amplifier drive switch is applicable as an example of preferable means for controlling a common source node potential of the sense amplifiers being activated.

BEST MODE FOR CARRYING OUT THE INVENTION

Figure 1:
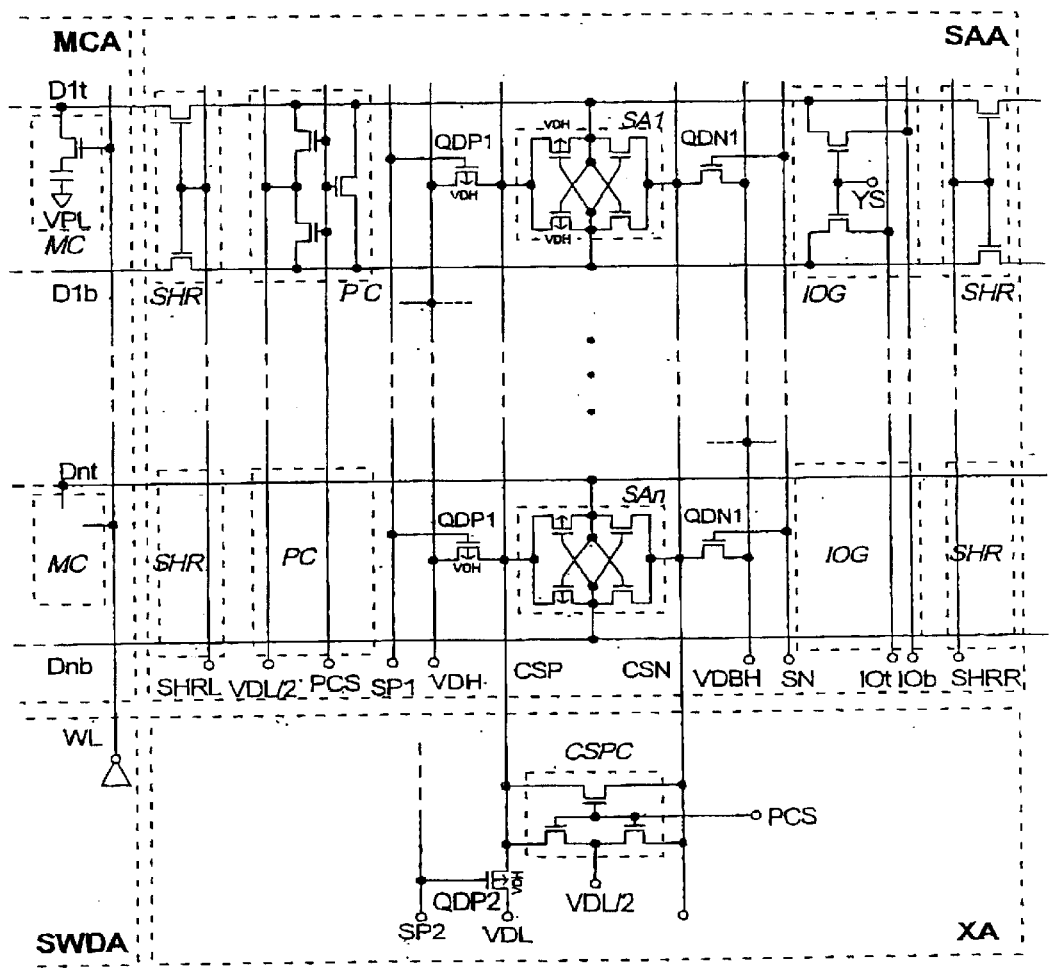
FIG. 1 is a diagram showing a sense amplifier circuit in a first preferred embodiment of the present invention.

The present invention will now be described in detail by way of example with reference to the accompanying drawings. It is to be understood that the present invention is not limited to the use of specific circuit elements in each block in the following preferred embodiments. In most applications, the circuit elements in each block may be formed on a semiconductor substrate such as a monocrystal silicon substrate using a known semiconductor device fabrication technique, e.g., a CMOS (Complementary MOS transistor) integrated circuit fabrication technique. In the drawings, a non-arrowed circuit symbol of MOSFET (Metal Oxide Semiconductor Field Effect Transistor) represents an N-type MOSFET (NMOS), and an arrowed circuit symbol of MOSFET represents a P-type MOSFET (PMOS) For the sake of simplicity, each MOSFET is hereinafter referred to just as a MOS. Note that the present invention is not limited to a circuit comprising a field effect transistor having an oxide insulation film sandwiched between a metal gate and a semiconductor layer. It is to be understood that the present invention is applicable to a circuit comprising an ordinary type of FET such as a MISFET (Metal Insulator Semiconductor Field Effect Transistor).

<Embodiment 1>

Referring to FIG. 1, there is shown a detailed diagram of a sub-memory array SMA in a dynamic random access memory. In the present preferred embodiment, an over-driving operation is performed on one of P-side and N-side source nodes of a sense amplifier in the initial period of amplification. The present preferred embodiment is characterized in that a plurality of over-driving drive switches QDP1 are distributively disposed in a sense amplifier area SAA for driving a P-side common source line CSP. Before proceeding to detailed description of FIG. 1, the following explains the present invention in terms of entire positional relationship in a memory device with reference to FIGS. 22 and 23.

Figure 22:
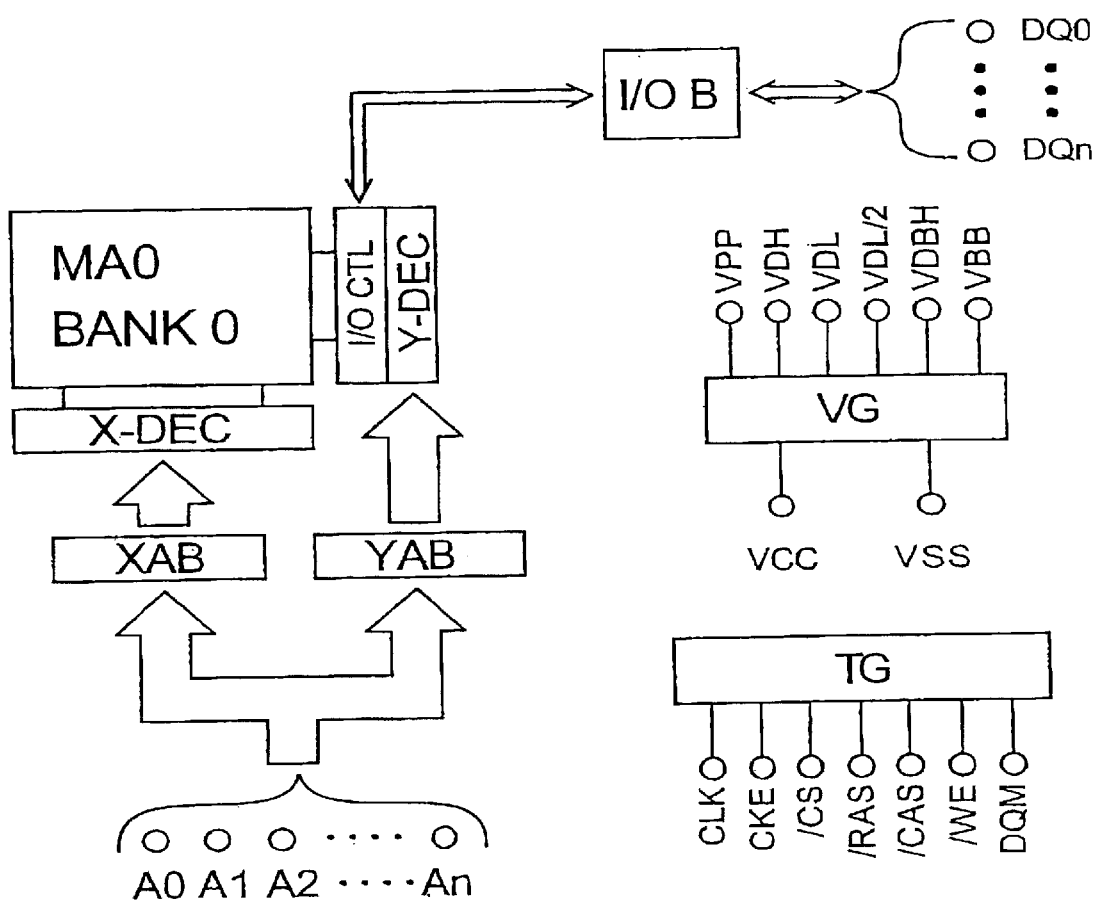
FIG. 22 is an entire configuration diagram of a synchronous dynamic random access memory in an application of the present invention.

Referring to FIG. 22, there is shown an entire block diagram of a synchronous DRAM (SDRAM) in accordance with the present invention. Each circuit block is operated with timing of an internal control signal generated by a timing signal generator circuit TG to which a control signal is input. The following control signals are input to the TG under timing control of a clock signal CLK; a chip select signal/CS, row address strobe signal/RAS, column address strobe signal/CAS, and write enable signal/WE. A combination of one of these control signals and an address signal is referred to as a command signal. A clock enable signal CKE is used to determine whether or not to enable the clock signal. An input/output mask signal DQM is used to control a data input/output buffer I/OB for masking input/output data on input/output terminals (DQ0, . . . DQn).

The SDRAM employs an address multiplex method in which row and column addresses are input from address input terminals (A0, A1, . . . An) in time-division multiplexing. A row address input to a row address buffer XAB is decoded by a row decoder X-DEC to select a particular word line in a memory array MA0, and accordingly a memory cell for one word is selected. Then, when a column address is input to a column address buffer YAB, the column address is decoded by a column address decoder Y-DEC to perform further memory cell section for reading or writing. In most cases, the SDRAM is provided with a plurality of memory arrays (or memory banks) that are specified with respective bank addresses. In FIG. 22, only one memory array MA0 (BANK0) is shown as a representative array.

Internal power voltages generated by a voltage generator circuit VG of the SDRAM shown in FIG. 22 are described below. In the present preferred embodiment, a single power supply method is employed in which VCC (2.5 V) is supplied from an external circuit with reference to VSS (0 V). An internal power voltage having the highest potential is VPP (3.0 V), which is produced by a voltage boosting circuit containing a charge pump circuit, and the VPP thus produced is supplied to a word line drive circuit and other circuits. VDH (2.5 V=VCC) is used as a power voltage for operating peripheral circuits such as the XAB, YAB, IOB and X-DEC. VDL (1.5 V) and VDBH (0 V=VSS) are supplied to a sense amplifier for determining a data line restore potential, which will be described later. VDL is produced by a voltage down-converter circuit (voltage limiter). Since a half-precharge method is adopted in the present preferred embodiment, VDL/2 (0.75 V) to be supplied to a circuit such as a data line in a standby state is produced from the VDL. The VDL/2 is also used as a plate potential VPL for a memory cell. VBB (−0.75 V), used as a substrate potential for biasing a back gate of NMOS to the lowest circuit potential, is produced by the voltage boosting circuit containing the charge pump circuit.

Figure 23:
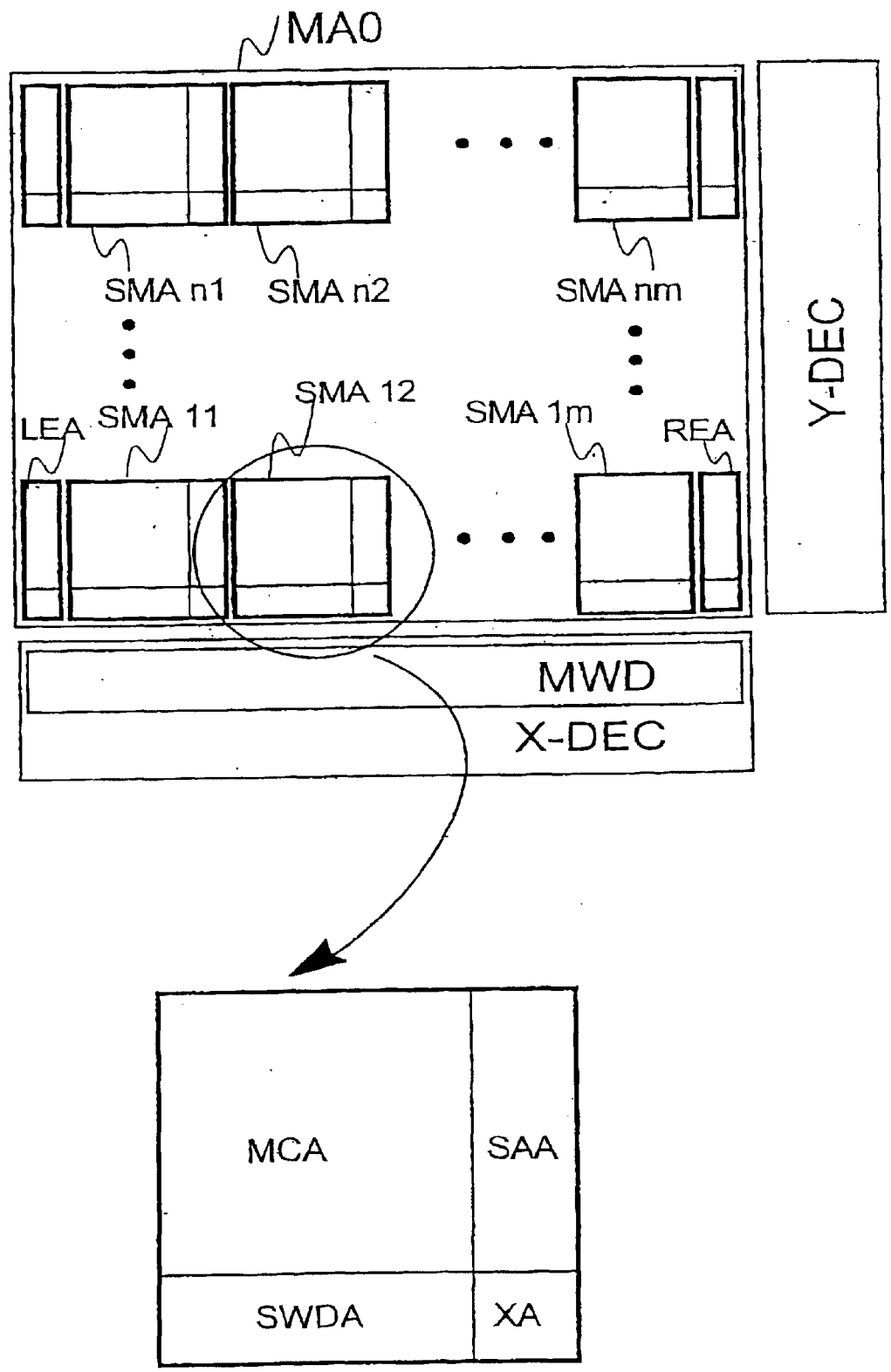
FIG. 23 is a diagram showing an arrangement in which a memory array is divided into sub-memory arrays.

Referring to FIG. 23, there is shown a detailed internal configuration of the memory array MA0 indicated in FIG. 22. The MA0 comprises sub-memory arrays SMA11 to SMAnm arranged in a matrix. The MA0 is arranged in a hierarchical word line structure (divided word line structure), though the present invention is not limited thereto. On one side of the MA0, there is disposed a row of main word drivers MWD. Main word lines connected with the MWD are provided in an upper metal wiring layer so that they are extended across a plurality of sub-memory arrays (e.g., from SMA11 to SMAn1). For column-wise selection, a common Y decoder method is employed in which a plurality of column select lines (YS lines) from the column decoder Y-DEC are extended across a plurality of sub-memory arrays (e.g., from SMA1$m$ to SMA11). At the left and right ends of SMA11 to SMA1$m$ in the MA0 shown in FIG. 23, there are provided a left end area LEA and a right end area REA used for termination of the sub-memory arrays. The LEA and REA are arranged in somewhat modified forms of SAA and XA. This formation is made in consideration of mat termination since a shared sense method is employed in which sense amplifiers are provided in an alternate arrangement structure.

As shown in the enlarged view in FIG. 23, the inside of each sub-memory array is divided into a memory cell area MCA, a sense amplifier area SAA, a sub word driver area SWDA, and a cross area XA. In this layout scheme, the MCA is formed in a square shape having first and second sides meeting each other at a corner common thereto, the SAA is formed in a rectangular shape along the first side of the MCA, and the SWDA is formed in a rectangular shape along the second side of the MCA. The XA is an area which is located outside the common corner to the first and second sides of the MCA and enclosed by the SAA and SWDA.

FIG. 1 shows a detailed diagram of the sub-memory array corresponding to the enlarged view in FIG. 23. In the memory cell area MCA, a plurality of data line pairs D1$t$, D1$b$ . . . Dn$t$, Dn$b$ are arranged to intersect a plurality of word lines WL for an array of memory cells, and each dynamic memory cell MC is connected at a predetermined point of intersection. The MC comprises a capacitor for storing data and a MOS transistor, which is of an N type in the present preferred embodiment. While the data lines and memory cells are formed in a so-called two-cross-points array structure (folded data line structure) in the present preferred embodiment, it is to be understood that the invention is not limited thereto and may also be applicable to a one-cross-point array structure (open data line structure).

In the sub word driver area SWDA, a plurality of sub word drivers SWD are provided respectively for a plurality of the word lines. The sub word driver is activated by logical-ORing a signal on the main word line described with reference to FIG. 23 and a control signal on an FX driver FXD, which is provided in the cross area XA (not shown in FIG. 1). Where a word shunt structure is employed instead of the hierarchical word line structure, the SWDA is provided with a lining word line, which is formed of a metallic material such as AL in an upper layer in lieu of the sub word driver. In the SWDA, a through hole and a contact are also provided for connection between a gate in a lower polysilicon layer and a common word line. In this arrangement, the SWDA may be referred to as a word shunt area.

The description of the sense amplifier area SAA is given below. In the SAA, elements such as a left/right shared switch SHR, a precharge circuit PC, a sense amplifier SA1 and a column switch IOG are provided for each pair of data lines (D1$t$, D1$b$). In practice of the present invention, 512 to 2048 pairs of data lines would be provided per memory cell area MCA. On this assumption, 256 to 1024 sense amplifiers are disposed in each SAA, i.e., the number of sense amplifiers is half the number of data line pairs because of an alternate arrangement structure of the sense amplifiers. The shared switch is provided as a changeover element for common use of the sense amplifier SA1 to memory cell areas on the left and right sides thereof. In the present preferred embodiment, the shared switch comprises an NMOS transistor, and gate control signals SHRL and SHRR thereof have a potential VPP, VDH or VDL during a period of data line precharge. For example, when access is made to the left-side memory cell area, a condition "SHRL=VPP or VDH" or a condition "SHRR=VDBH" is taken, i.e., either one of SHRL and SHRR is put into conduction without a decrease in NMOS threshold voltage. The PC is used to supply VDL/2 to each data line pair during a data line precharge period according to a control signal PCS. The column switch IOG is used to set up connection between a data line pair selected by a column select signal YS of the column decoder and a pair of common input/output lines IOt and IOb for forming a data input/output path extending to an external circuit.

The sense amplifier SA is a latch-type amplifier circuit having two CMOS inverters cross-coupled. More specifically, the sense amplifier SA comprises a source in common connection, a PMOS pair of cross-coupled gate and drain, and an NMOS pair of cross-coupled gate and drain. The sources of the PMOS and NMOS pairs are connected to P-side and N-side common source lines CSP and CSN respectively in common. For operation of an over-driving type of sense amplifier, it is required to provide a restore potential and an over-driving potential. The restore potential is a power supply potential used to determined high and low levels on each data line at the time of final amplification. The term "restore potential" is used since it is equal to a potential for memory cell re-write operation. The VDL corresponds to a high-side restore potential, and the VDBH corresponds to a low-side restore potential. In the present preferred embodiment, a high-side over-driving potential only is supplied, i.e., a condition "VDH (>VDL)" is provided.

On the P side of each sense amplifier, a first power line for supplying the high-side over-driving potential VDH is arranged in parallel with the P-side common source line CSP. A plurality of switches QDP1 are distributively provided between the first power line and the P-side common source line CSP. In the example shown in FIG. 1, there is provided one PMOS per sense amplifier. On the other hand, the high-side restore potential VDL is not provided in the SAA. Using switches QDP2 concentratively disposed in the cross area XA, the VDL is supplied from one end of the P-side common source line CSP. A precharge circuit CSPC on the common source line is designed to perform short-circuiting for precharge and VDL/2 compensation for leakage through the use of each end of the CSP and CSN disposed in the cross area XA.

On the N side of each sense amplifier, a second power line for supplying the low-side restore potential VDBH is arranged in parallel with the N-side common source line CSN. A plurality of switches QDN1 are distributively provided between the second power line and the N-side common source line CSN. In the example shown in FIG. 1, there is provided one NMOS per sense amplifier in a fashion that a pair of QDN1 and QDP1 is formed.

In the SAA, each sense amplifier PMOS pair and each over-driving switch MOS (QDP1) are formed in a common N-type well on a P-type substrate though the invention is not limited thereto. As a P-side substrate bias, the VDH is applied to the N-type well. That is to say, the back gate of each PMOS is biased to the VDH which is equal to an over-driving potential. In a modified embodiment, the back gate of each PMOS may also be arranged so that biasing to the VPP is made. In the same manner, each sense amplifier NMOS pair and each QDN1 are formed in a common P-type doped semiconductor region (in a P-type substrate or in a triple well formed on a P-type substrate), and as an N-side substrate bias, the VDBH or VBB is applied to the P-type doped semiconductor region.

Figure 24:
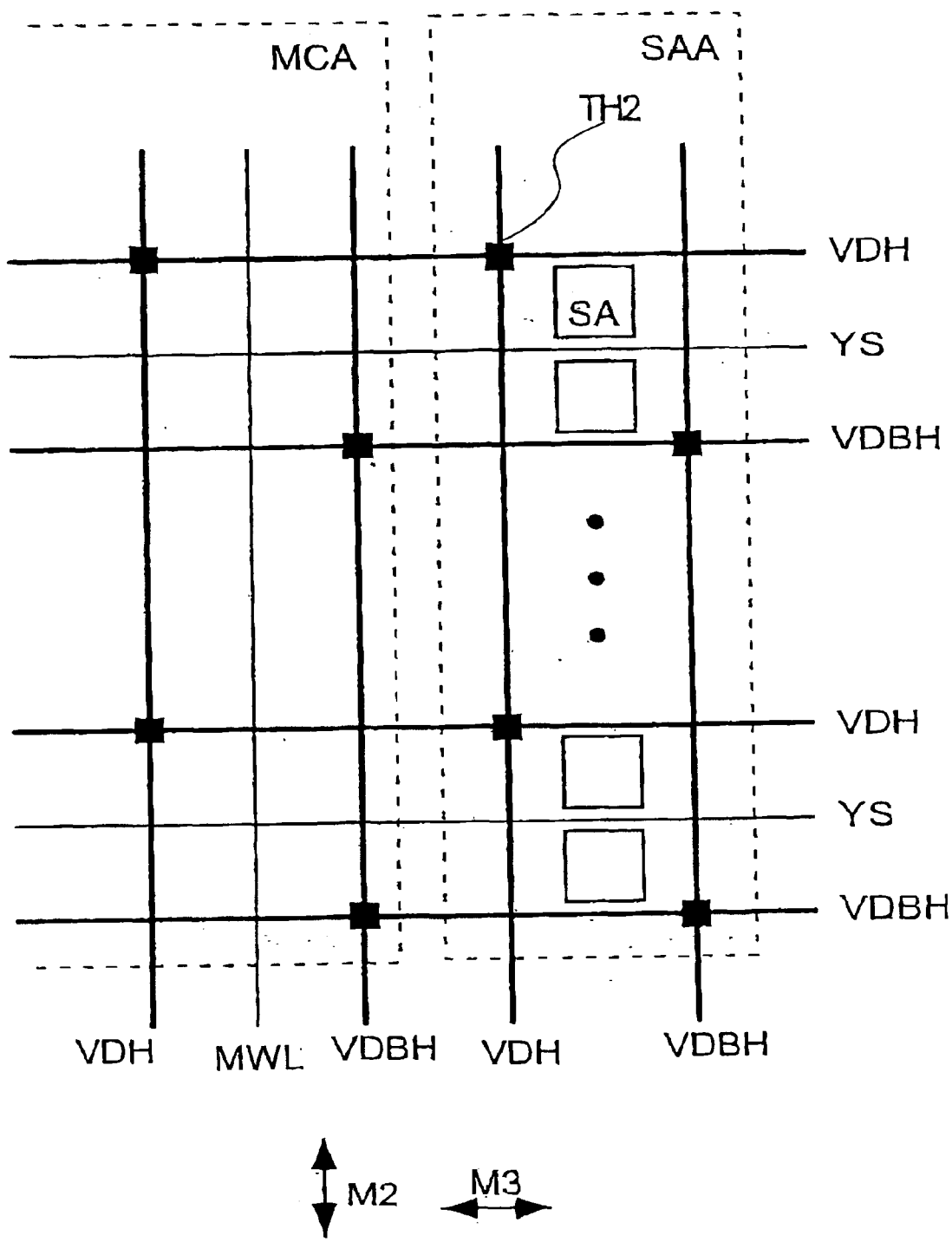
FIG. 24 is a diagram showing a meshed power line circuit in a sub-memory array.
Figure 25:
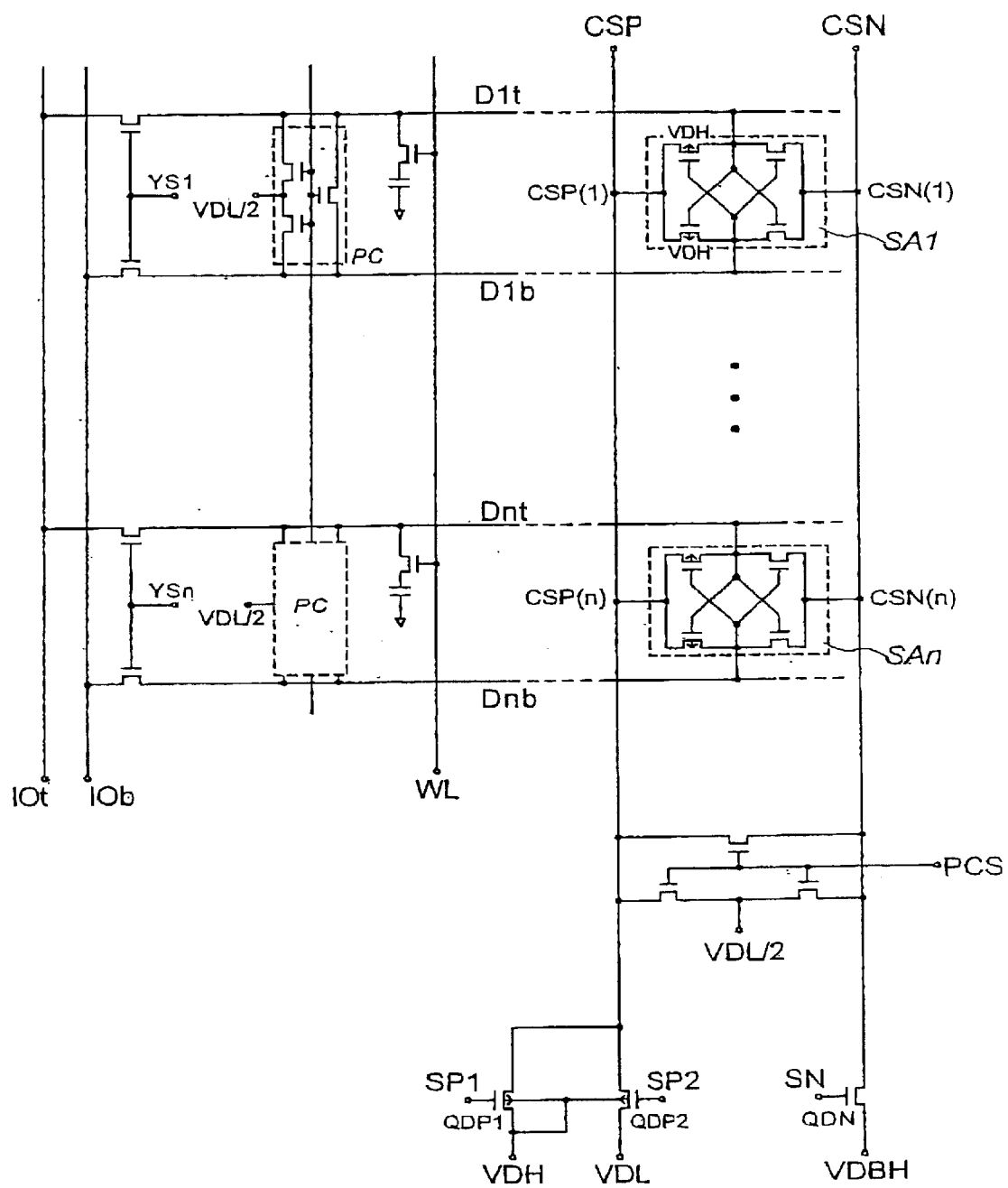
FIG. 25 is a circuit diagram showing an essential part of a DRAM containing an over-driving drive circuit examined prior to preparation of this patent application.
Figure 26:
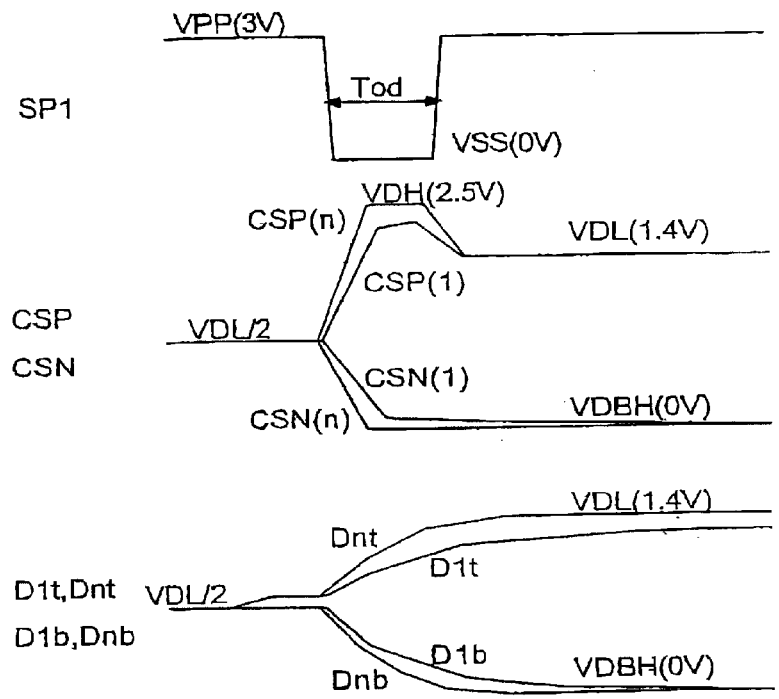
FIGS. 26(a) and (b) are diagrams showing examples of operating waveforms on common source and data lines in sense amplifier operation in connection with FIG. 25.
Figure 26:
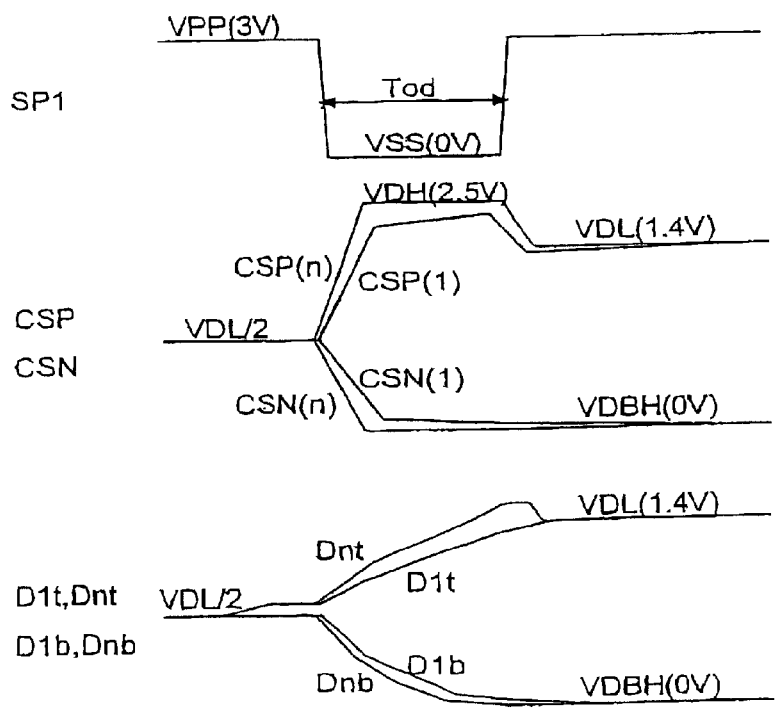

Referring to FIG. 24, there is shown an arrangement of wiring for feeding the potentials VDH and VDBH used as power supply voltages in FIG. 1. The VDH and VDBH are supplied through a meshed power line circuit having a low line impedance shown in FIG. 24. Vertical power lines in FIG. 24 are formed in a second metal wiring layer M2 (made of a material such as aluminum). In the memory cell area MCA, VDH and VDBH supply lines are arranged among and in parallel with main word lines MWL. In practice of the present invention, one main word line MWL would be provided per four or eight word lines, for example. In the sense amplifier area SAA, VDH and VDBH supply lines are also arranged in parallel with the main word lines MWL. The VDH and VDBH supply lines in the wiring layer M2 correspond to the first and second power lines described with reference to FIG. 1.

On the other hand, horizontal power lines in FIG. 24 are formed in a third metal wiring layer M3 (made of a material such as aluminum) which is located at an upper position with respect to the wiring layer M2. Column select lines YS are arranged across the memory cell area MCA and the sense amplifier area SAA. One column select line YS is provided per four data lines, for example. In the memory cell area MCA and the sense amplifier area SAA, VDH and VDBH supply lines are arranged among and in parallel with the column select lines. The VDH and VDBH supply lines, i.e., the VDH and VDBH power lines in the wiring layers M2 and M3 are connected respectively at intersection points using through-hole contacts TH2 formed between the wiring layers M2 and M3. The intersecting power lines in the wiring layers M2 and M3, i.e., the VDH and VDBH lines formed in a meshed power line structure have a low impedance.

Figure 2:
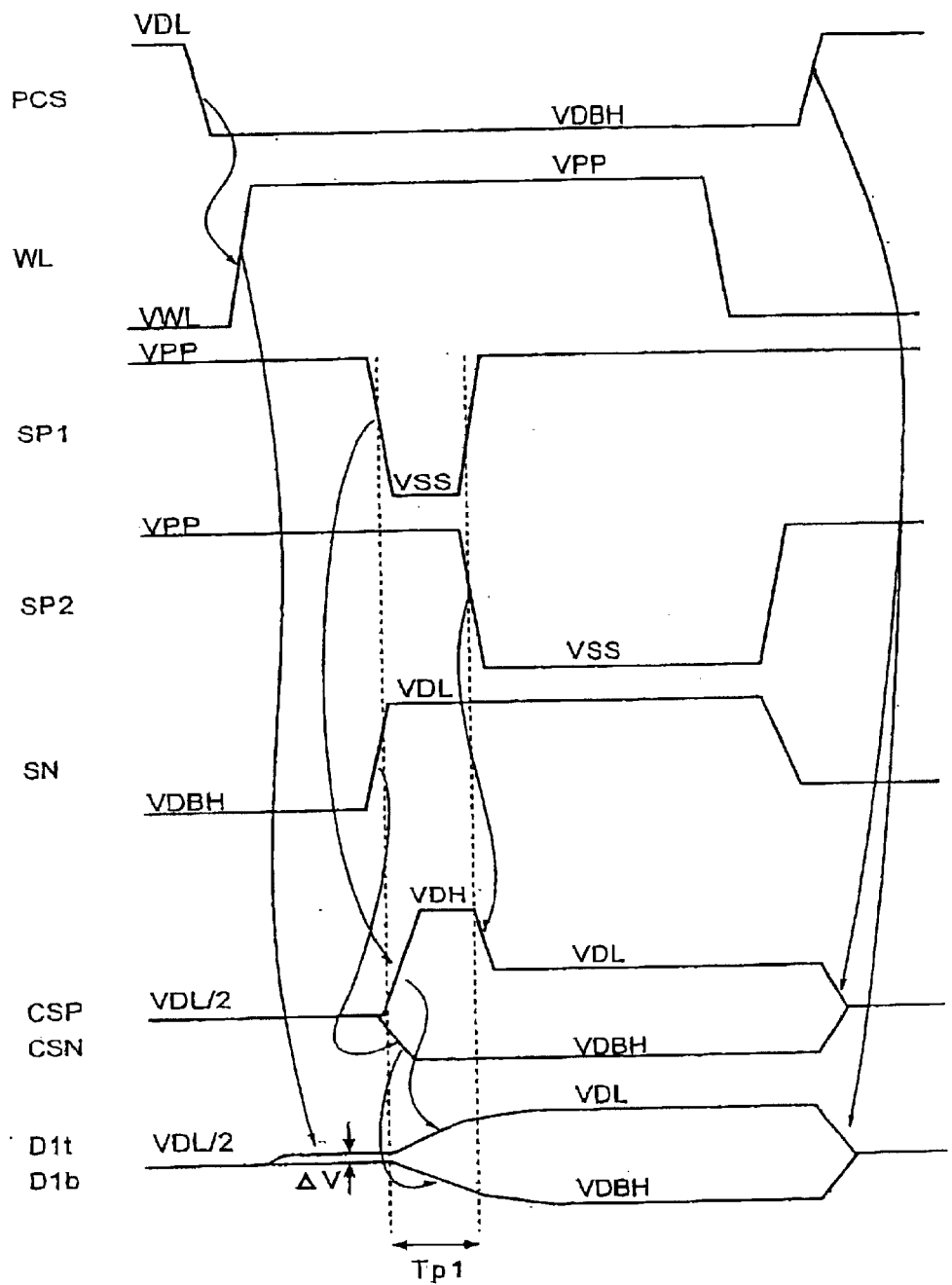
FIG. 2 is a diagram of operating waveforms in the first preferred embodiment of the present invention.

Referring to FIG. 2, there is shown an operation timing chart of the sub-memory array diagrammed in FIG. 1. On input of a low-active command to the SDRAM, memory cells connected with a particular main word line in a particular bank are read through sense amplifiers simultaneously for amplification. Thereafter, when a precharge command is input, the memory cells are deselected to set up a precharge state which is a waiting state for the next read operation. The waveforms shown in FIG. 2 indicate operations to be performed in the sub-memory array diagrammed in FIG. 1 from a point of time the low-active command is input until a point of time the precharge command is input.

When a precharge control signal PCS is made active on the data line and the common source line, VDL/2 precharging of the data line and the common source line is stopped. Then, one of plural word lines WL is selected to cause a transition from a VWL level (VWL=VSS under normal condition) to a VPP level. A memory cell MC is thus selected, and the VPP is applied to the NMOS transistor gate thereof for activation. Then, a charge accumulated in a capacitor for storing data is read out onto data lines D1t . . . Dnt connected with the memory cell MC. A charge in the cell causes a minuscule voltage difference between a pair of the data lines. When data in the cell is "H", the voltage level of D1t becomes approximately 100 mV higher than that of D1b. In this example, it is assumed that "H" data is stored in the cell capacitor of the memory cell MC. In a situation where low-level data "L" is stored in the capacitor of the memory cell MC, the same sequence is performed except that a lower potential is used.

At the start of sense operation after completion of the reading of cell data, an N-side common source drive control signal line SN is set from the VDBH to a level higher than the VDL to activate a QDN, thereby driving the CSN to make a transition from the VDL/2 to the VDBH. At the same time or after a lapse corresponding to the number of delay stages, a first P-side common source drive control signal line SP1 is set from the VPP to the VSS, for example, to activate the QDP1, thereby driving the CSP to make a transition from the VDL/2 to the VDH. At this step, the VDH is supplied through the low-impedance meshed power line circuit and the distributively arranged switches QDP1 as described with reference to FIGS. 1 and 2. Therefore, the sense amplifiers SA1 to SAn are activated simultaneously with almost the same timing, thus making it possible to suppress variation in over-driving for the SA1 to SAn. This also enables high-speed driving of the common source lines CSP and CSN. Further, in over-driving drive operation, since a source-drain voltage and a gate-source voltage of a PMOS transistor in the SA become higher than the VDL/2, it is possible to amplify a minuscule voltage difference ΔV on a pair of data lines at high speed.

Under condition that amplification on the high-level-side data line D1t is not yet completed, a sense amplifier over-driving period is set to a time period Tp1 to be taken for a potential on the data line D1t to become close to the VDL. In consideration of power consumption and other factors, it is preferable to stop over-driving before the potential on the data line becomes higher than the VDL. After a lapse of the time period TP1, the SP1 is set from the VSS to a level higher than the VDH, e.g., the VPP. Then, a second P-side common source drive control signal line SP2 is set from the VPP to the VSS, for example, thereby activating the QDP2 to set the CSP to the VDL. Thus, the high-level-side data line is maintained at the VDL.

After input of the precharge command, the following operation is performed. The selected word line WL is set from the VPP to the VWL. Thereafter, the SN is set from the VDL or VPP to the VDBH, and the CSN is disconnected from the VDBH. At almost the same time, the SP2 is set from the VSS to the VPP, and the CSP is disconnected from the VDL. The CSN and CSP, which have thus been disconnected from the power supply, and data line pairs D1t, D1b . . . Dnt, Dnb are precharged to the VDL/2 according to the precharge control signal PCS.

In the present preferred embodiment, the following advantageous effects are provided: (1) At the time of over-driving, a charge current is output from the over-driving power supply to each data line, and the charge current thus output is supplied through the meshed power line circuit and the plural switches QDP1 which are distributively disposed in the vicinity thereof. Thus, a current concentration to a particular sense amplifier and a particular source line CSP can be circumvented to allow over-driving for any sense amplifiers SA1 to SAn with an equal level of over-driving voltage (VDH). (2) An over-driving period can be set according to a time period that the QDP1 is activated with a gate signal on the SP1, thereby allowing uniform operation among the sense amplifiers SA1 and SAn. Thus, it is possible to reduce a difference in over-driving amplitude and period with respect to far and near positions of the sense amplifiers arranged distributively. (3) Since a charge current from each data line to terminal VDBH is delivered to the meshed power line circuit VDBH on each array through a multiplicity of the switches QDN, a current concentration to a particular sense driver and CSN can be prevented.

In the present preferred embodiment, either one or both of the QDP1 and QDP2 may be formed in an NMOS transistor structure. In this case, it is required to invert control signal logic employed for PMOS transistor formation. Where NMOS transistors are used as the QDP1 and QDP2, a gate-source voltage becomes negative in an inactive state, thereby providing an advantage that a leak current from the VDH/VDL to the CSP can be reduced.

While one MOS switch QDP1 and one MOS switch QDN1 are disposed per sense amplifier in the present preferred embodiment, there may also be provided such a modified arrangement that one MOS switch QDP1 and one MOS switch QDN1 are disposed per two, four or eight sense amplifiers. Further, in another modified arrangement, the MOS switches QDP1 and QDN1 may be structured as one MOS switch having a long gate for single-row-form connection instead of dividing a diffusion layer in which channels are structured along the sense amplifiers. Since a feature of the present invention is to use the MOS switches distributively arranged in the SAA area for the purpose of over-driving, it is not important whether a channel width is divided into sections or not.

<Embodiment 2>

Figure 3:
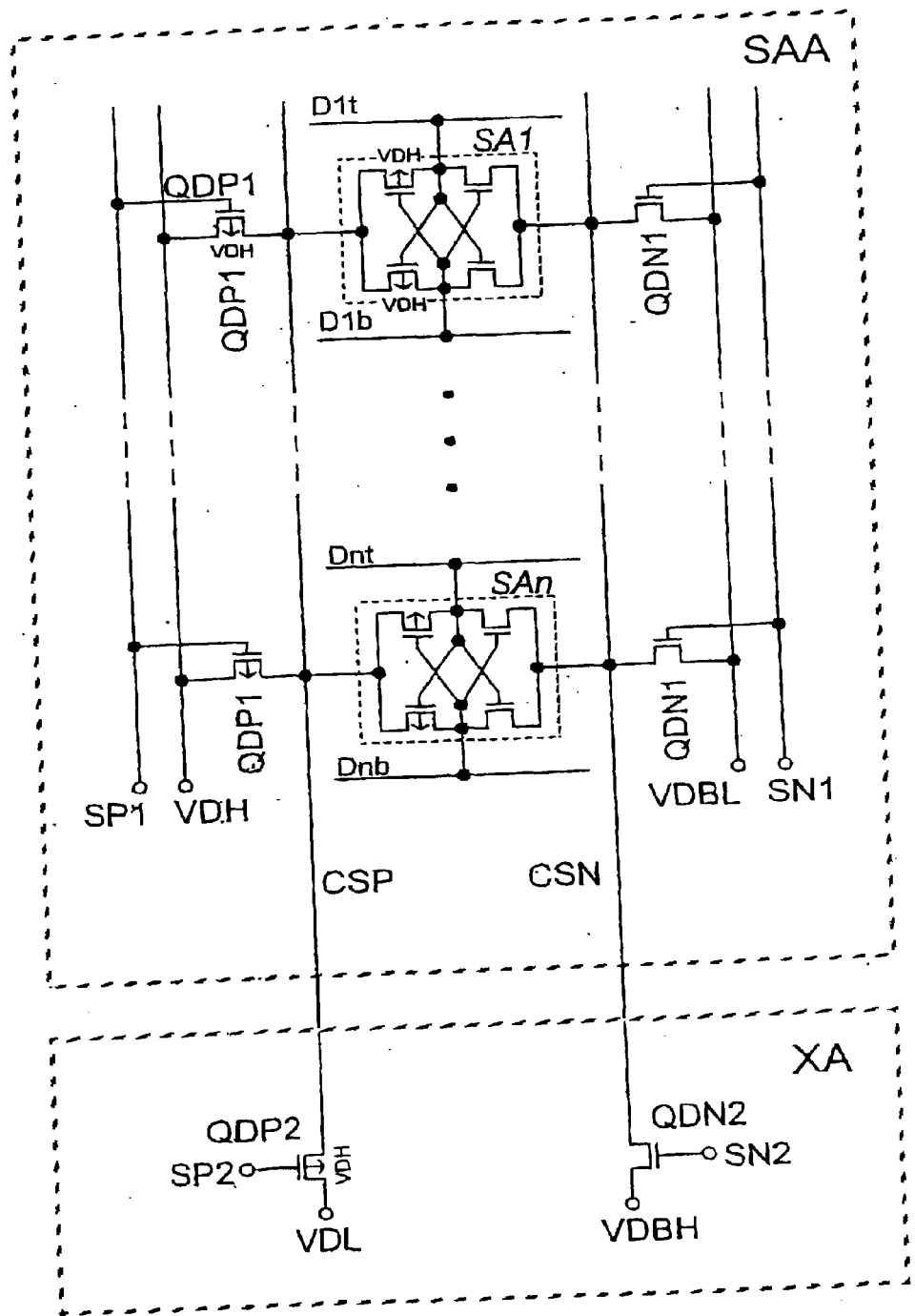
FIG. 3 is a diagram showing an essential part of a sense amplifier circuit in a second preferred embodiment of the present invention.

Referring to FIG. 3, there is shown a configuration of a sense amplifier circuit in a second preferred embodiment of the present invention. An essential part of the sense amplifier circuit is diagrammed in FIG. 3, and the other parts thereof are the same as those in the first preferred embodiment. In the second preferred embodiment, N-side over-driving is also provided in addition to P-side over-driving in the scheme shown in FIG. 1. The second preferred embodiment is different from the first preferred embodiment in that a concentrative-type switch QDN2 is added at one end of the N-side common source line CSN in the cross area XA. Through the QDN2, the low-side restore potential VDBH (VSS under normal condition) on each data line is applied. In the meshed power line circuit, a voltage VDBL lower than the VDBH is supplied as an N-side over-driving power voltage instead of the VDBH. The VDBL is applied to the N-side common source line through the distributively arranged switches QDN1. Since the over-driving of the N-side common source line is performed with the VDBL, each back gate of the sense amplifier NMOS pair and QDN1 is biased to a voltage equal to or lower than the VDBL. In the above-mentioned arrangement shown in FIG. 3, the VDL and VDBH are used as high-side and low-side restore potentials respectively, and the VDH (>VDL) and VDBL (<VDBH) are used as high-side and low-side over-driving potentials respectively.

Figure 4:
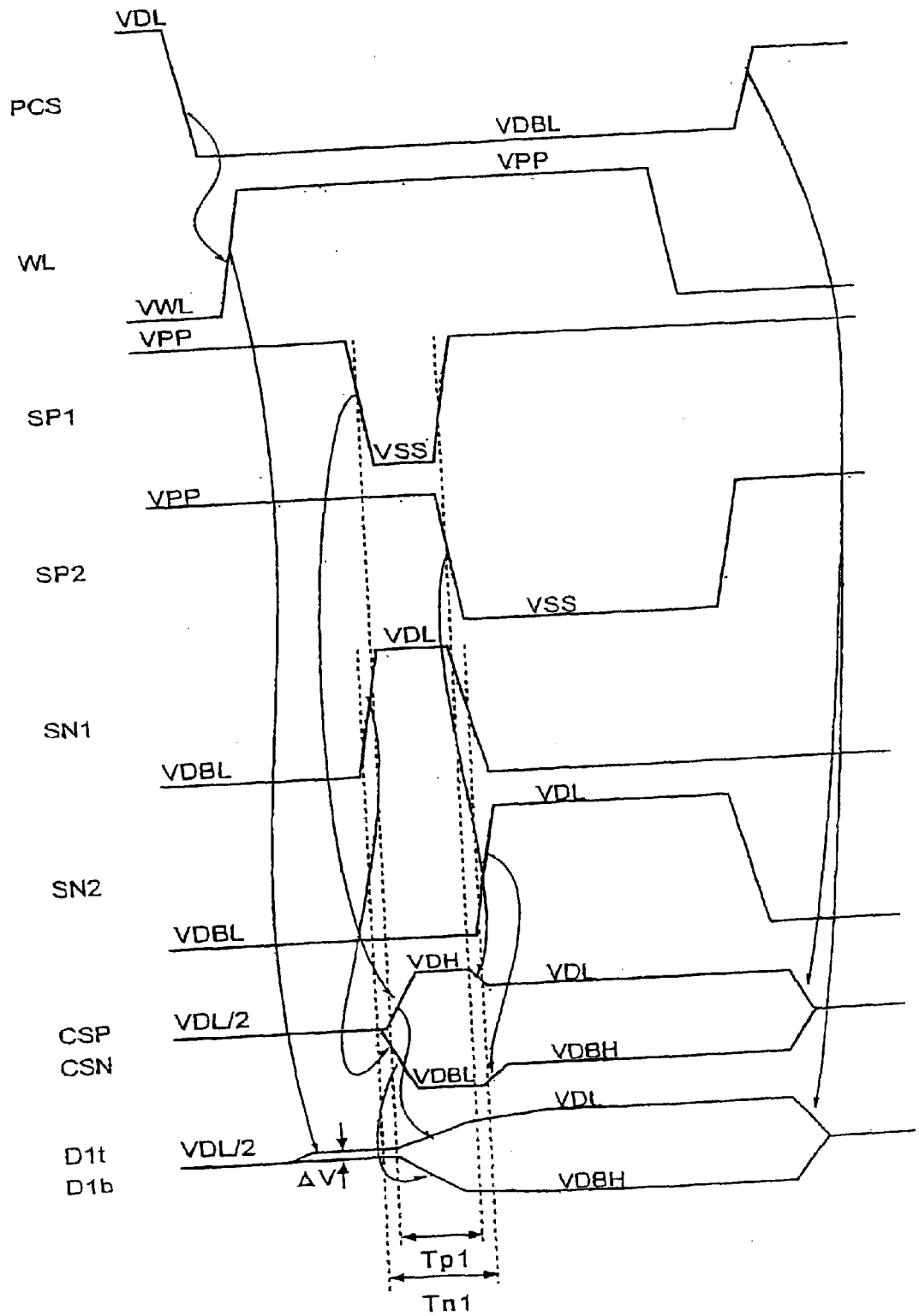
FIG. 4 is a diagram of operating waveforms in the second preferred embodiment of the present invention.

Referring to FIG. 4, there is shown a diagram of operating waveforms in the scheme presented in FIG. 3. As in the case of the first preferred embodiment, it is assumed that "H" data is stored in the cell capacitor of the memory cell MC. Unlike the first preferred embodiment shown in FIG. 2, SN1 and SN2 are controlled because of addition of N-side over-driving.

After completion of the reading of cell data, a voltage on the D1t becomes approximately 100 mV higher than that on the D1b. Then, the SN1 makes a level transition from the VDBL to the VDL or VPP, thereby activating the QDN1. At the same time or after a lapse corresponding to the number of delay stages, the SP1 is set from the VPP to the VSS to activate the QDP1. Then, the CSN makes a transition from the VDL/2 to the VDBL, and the CSP makes a transition from the VDL/2 to the VDH. At the start of these transitions of the CSN and CSP to the VDBL and VDH respectively, the SA1 connected with a pair of the data lines D1t and D1b is activated to amplify a minuscule voltage difference between the data lines. At this step, the SA1 is activated with an amplitude larger than a data-line amplitude VDL (VDH-VDBL) through over-driving. Therefore, a source-drain voltage and a gate-source voltage of the NMOS and PMOS transistors constituting the SA1 are increased to enable high-speed operation. To prevent an increase in charge-discharge power due to excessive amplification, the QDN1 is activated under condition that amplification on the low-level-side data line to the VDBL is not yet completed; more specifically, the QDN1 is activated during a time period Tn1 to be taken until a state not reaching a level lower than the VDBH persists. Similarly, the QDP1 is activated under condition that amplification on the high-level-side data line to the VDH is not yet completed; more specifically, the QDP1 is activated during a time period TP1 to be taken until a state not exceeding the VDL persists. Control of activation time is carried out by the SP1 and SN1. As in the first preferred embodiment, an over-driving period in the SAn is equal to that in the SA1, and the Tn1 and TP1 are set on the low level side and high level side respectively. Since an over-driving voltage at this step is supplied by the QDN1 and QDP1 located near the SAn, the VDBL and VDH are set on the low level side and high level side respectively in the same manner as in the SA1.

After completion of over-driving operation, the SN2 is set from the VDBL to the VDL or VPP, and the CSN is set to the VDBH. The activation timing of the SN2 is so controlled that the QDN1 and QDN2 are made active simultaneously to prevent connection between the VDBL and the VDBH through the CSN. Thus, the low-level-side data line D1b is maintained at the VDBH. Further, the SP2 is set from the VPP to the VSS, thereby setting the CSP to the VDL. The activation timing of the SP2 is so controlled that the QDP1 and QDP2 are made active simultaneously to prevent connection between the VDH and the VDL through the CSP. Thus, the high-level-side data line D1t is maintained at the VDL. Finally, the word line goes low for restoration to a precharge state in the same manner as in FIG. 2.

In the second preferred embodiment, the following advantageous effects are provided: (1) Similarly to the first preferred embodiment, in over-driving on the high-level-side data line, an equal over-driving voltage and an equal over-driving period can be set for all the sense amplifiers SA, thereby making it possible to reduce a difference in sense operation speed with respect to far and near positions of the sense amplifiers-arranged distributively. (2) Further, unlike the first preferred embodiment, over-driving is performed on the low-level-side data line also, which allows shortening a sense operation time for use with the same data line amplitude. Since over-driving on the low level side is also performed as noted above, it is possible to circumvent a possible trouble due to a smaller data line amplitude, i.e., a decrease in operating voltage. (3) Still further, in over-driving on the low-level-side data line, a current concentration to a particular sense driver and a particular CSN in sense operation can be circumvented since there are provided a multiplicity of the switches QDN1 and the meshed power line circuit on each array. Even during an over-drive period, common signal SN1 setting can be made for the sense amplifiers SA1 to SAn. Thus, it is possible to reduce a difference in over-driving amplitude and period with respect to far and near positions of the sense amplifiers arranged distributively. (4) In the second preferred embodiment, just one MOS element is additionally provided in the cross area, thereby resulting in no virtual increase in the size of the sense amplifier area.

<Embodiment 3>

Figure 5:
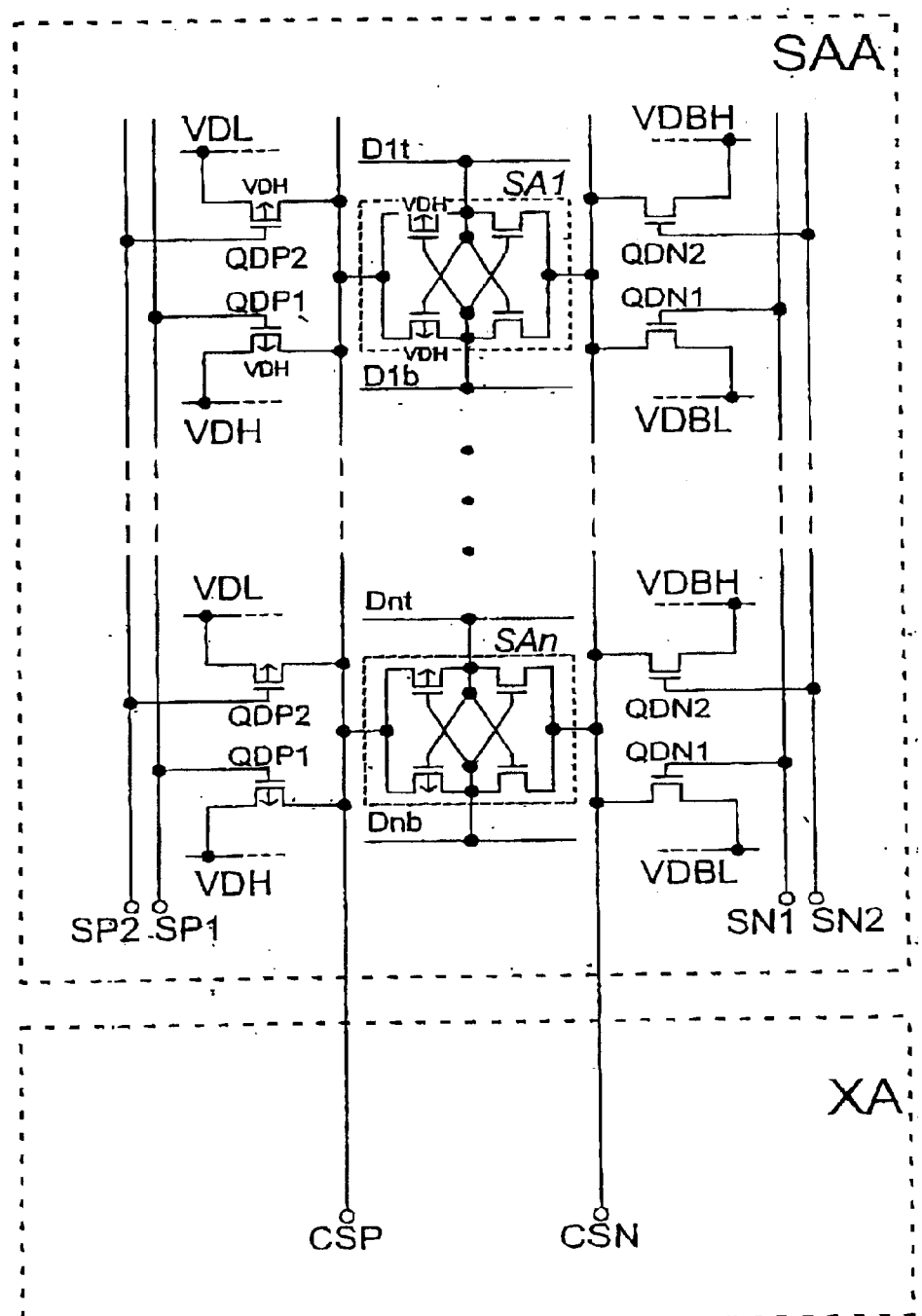
FIG. 5 is a diagram showing an essential part of a sense amplifier circuit in a third preferred embodiment of the present invention.
Figure 6:
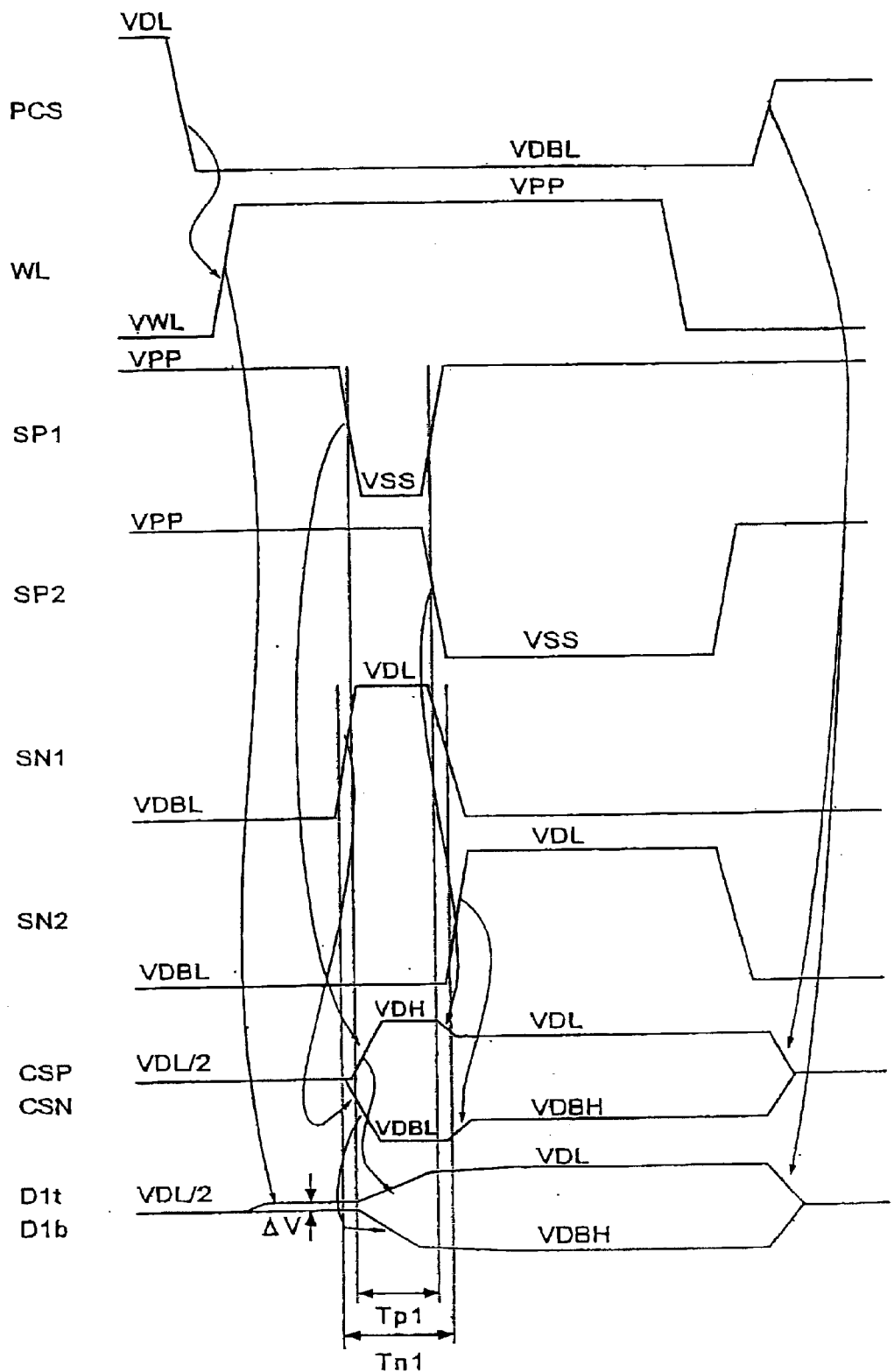
FIG. 6 is a diagram of operating waveforms in the third preferred embodiment of the present invention.

Then, the following describes the configuration of a sense amplifier circuit in a third preferred embodiment with reference to FIG. 5. The third preferred embodiment is a modification of the second preferred embodiment shown in FIG. 3, based on the configuration shown in FIG. 1. While the switches QDP2 and QDN2 for restore operation are concentratively arranged in the cross area XA in the second preferred embodiment, there are distributively arranged switches QDP2 and QDN2 in the sense amplifier area SAA in the third preferred embodiment. The distributed arrangement of the QDP2 and QDN2 and the meshed power line structure of the VDL and VDBL are provided similarly to the first preferred embodiment shown in FIG. 1. FIG. 6 shows a diagram of operating waveforms in the scheme presented in FIG. 5. The operating waveforms in FIG. 6 are the same as those in FIG. 4.

In the third preferred embodiment, the following advantageous effects are provided: (1) As in the second preferred embodiment, over-driving is performed on both the high-level-side and low-level-side data lines to realize high-speed sense operation. (2) An equal over-driving voltage and an equal over-driving period can be set for all the sense amplifiers SA, thereby making it possible to reduce a difference in sense operation with respect to far and near positions of the sense amplifiers arranged distributively. (3) As compared with the second preferred embodiment, a current concentration to a particular CSN and a particular CSP can be circumvented even in restore operation since there are provided a multiplicity of the switches QDN2 and QDP2 in the sense amplifier area. (4) All the sense drivers are disposed in the sense amplifier area, thereby making it possible to simplify the layout of elements other than the sense amplifiers.

<Embodiment 4>

Figure 7:
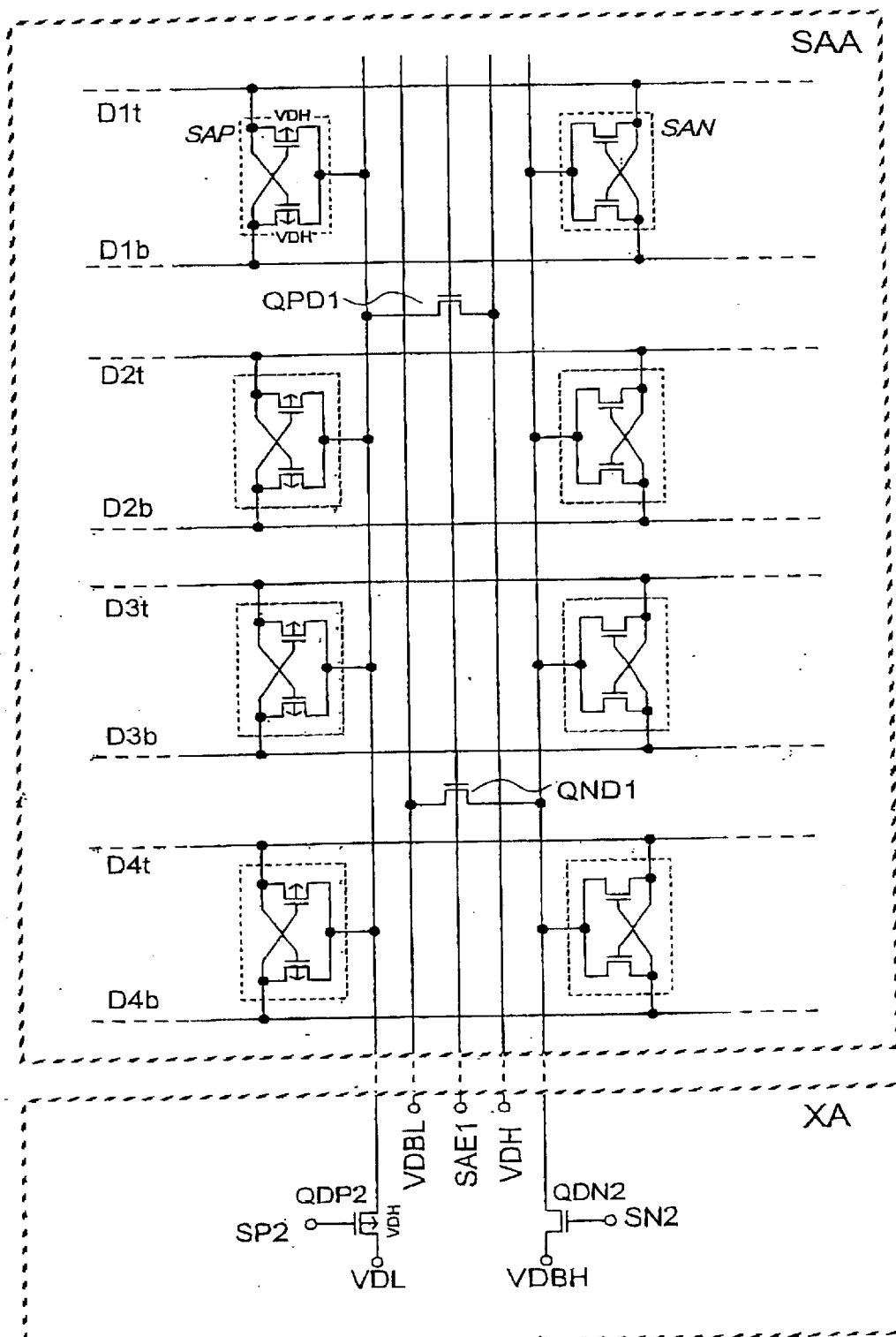
FIG. 7 is a diagram showing a sense amplifier circuit in a fourth preferred embodiment of the present invention.

Referring to FIG. 7, there is shown a configuration of a sense amplifier circuit in a fourth preferred embodiment of the present invention. The fourth preferred embodiment is also based on the first preferred embodiment. The fourth preferred embodiment is characterized in that all the P-side and N-side over-driving switches MOS are structured using transistors of the same conduction type, e.g., NMOS transistors as shown in FIG. 7, in that gate signals thereof are used in common, and in that the P-side and N-side over-driving switches are driven by a signal having a level sufficiently higher than the over-driving voltage VDH such as the VPP corresponding to a word-line boosted level. Since the P-side over-driving switch of an NMOS transistor type is used, a voltage drop due to the P-side NMOS transistor can be prevented in the fourth preferred embodiment. The fourth preferred embodiment is a modification of the second preferred embodiment shown in FIG. 3 in which the over-driving switches MOS are distributively arranged. In the fourth preferred embodiment, one P-side over-driving switch MOS QDP1 and one N-side over-driving switch MOS QDN1 are disposed per four sense amplifiers in the sense amplifier area SAA. The gates of the QDN1 and QDP1 have a common connection to an over-driving control signal line SAE1. The high-side and low-side over-driving potentials VDH and VDBL are supplied through the meshed power line circuit similarly to the other preferred embodiments described in the foregoing. The restore potentials are supplied through switches QDP2 and QDN2 concentratively disposed in the cross area XA in the same manner as in the scheme shown in FIG. 3.

Figure 12:
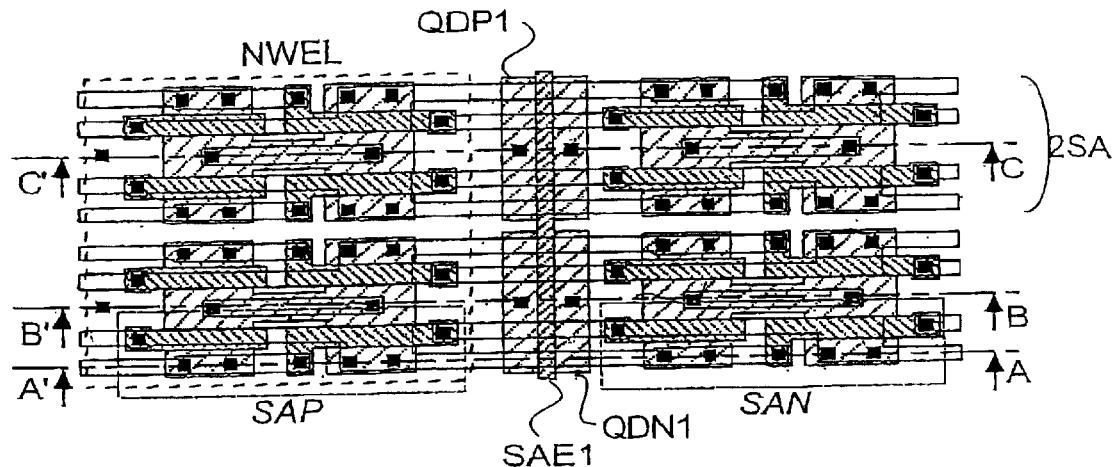
FIGS. 12(a) and (b) are diagrams showing layout schemes of the sense amplifier circuits in the fourth and fifth preferred embodiments.
Figure 12:
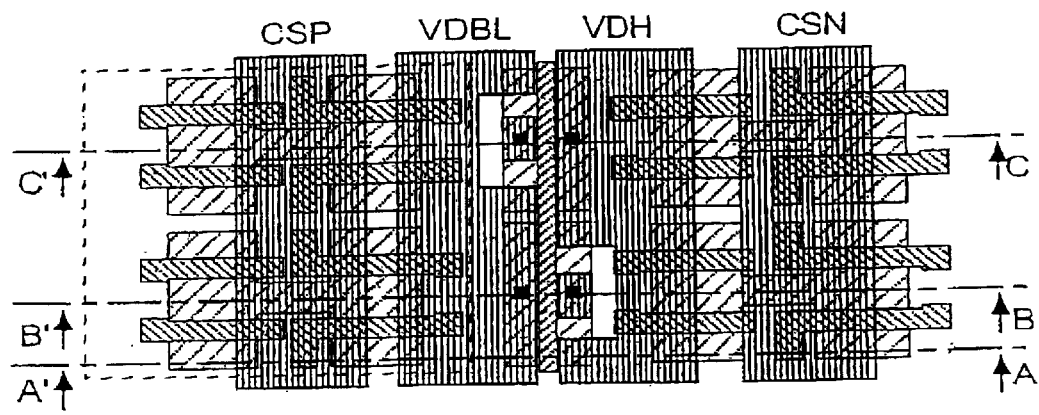

Referring to FIGS. 12(a) and (b), there are shown plan layout views of a sense amplifier circuit in the fourth preferred embodiment. In FIG. 12(a), four pairs of data lines are diagrammed. For the sake of simplicity, a first metal wiring layer (metal 1, M1), transistor gates, gate wiring (FG), a diffusion layer, and NWEL only are shown. A designation SAN indicates an NMOS transistor part of the SA, and a designation SAP indicates a PMOS transistor part thereof. The switches QDN1 and QDP1 comprise NMOS elements having gates in a single-row form between the SAN and SAP. The fourth preferred embodiment is characterized in that the NMOS elements arranged in a single-row form are allocated to the QDN1 and QDP1 in an alternate fashion. In this alternate arrangement, one control electrode SAE1 is used in common, thereby contributing to reduction in the size of the layout area. While one QDN1 and one QDP1 are disposed between the SAN and SAP per four data line pairs in the layout scheme shown in FIG. 12(a), it is to be understood that the present invention is not limited to this disposition. For example, in a modified form, one QDN1 and one QDP1 may be disposed per eight or sixteen data line pairs. In consideration of connection with both the P-side and N-side common sources, it would be most rational to arrange the QDN1 and QDP1 between the SAN and SAP in the sense amplifier area. However, it will be appreciated that the present invention is not limited to this arrangement.

Figure 9:
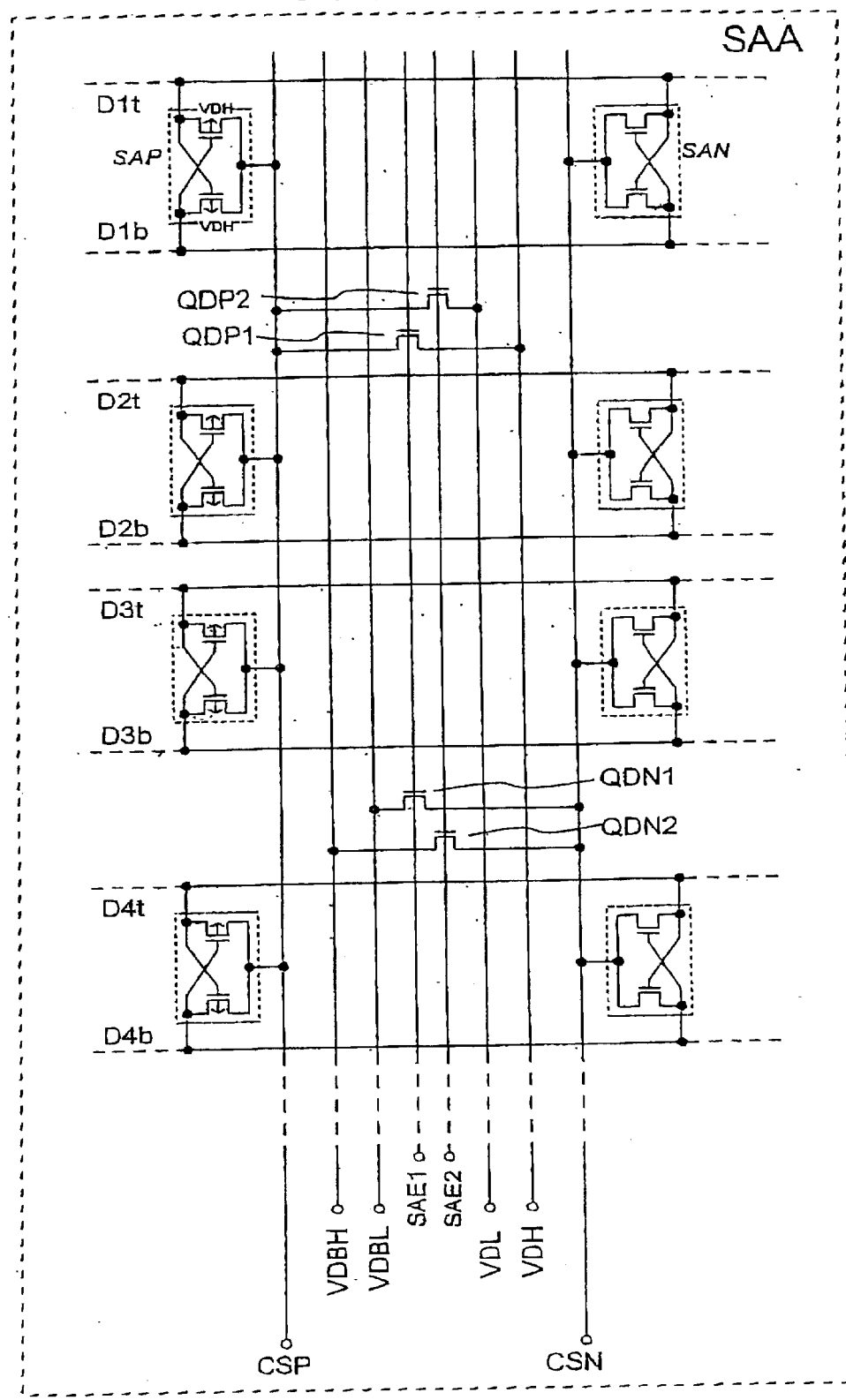
FIG. 9 is a diagram showing an essential part of a sense amplifier circuit in a fifth preferred embodiment of the present invention.

FIG. 12(b) is a plan layout view of a sense amplifier circuit wherein the same layer M1 as that in FIG. 12(a) is omitted and a second metal wiring layer (metal 2, M2) located above the M1 is added. In the M2, the P-side common source line CSP, power line VDBL for supplying VDBL, power line VDH for supplying VDH, and N-side common source line CSN are formed in succession. These four wiring lines are extended in the direction in which the sense amplifiers are arranged in a single-row form (in the extending direction of the word line). This arrangement of the four wiring lines is made for the purpose of reducing the size of the sense amplifier circuit layout area in the present preferred embodiment. The above arrangement is reflected in the circuit scheme shown in FIG. 7, i.e., FIG. 7 is a simplified diagram of the sense amplifier circuit layout. In FIG. 9 and the subsequent circuit schemes to be described later, concrete essential parts of respective circuit configurations are diagrammed in the same manner.

As to the channel width structures of the QDP1 and QDN1 shown in FIG. 12(a), the channel width of the QDP1 is preferably equal to that of the QDN1 (it is preferable to form NMOS elements having the same size). Thus, the sense amplifier SAN turns on before the SAP turns on. In the SAN comprising the NMOS transistor which has smaller fluctuation in Vt due to process variation than the PMOS, differential amplification is started using a minuscule voltage difference, thereby making it possible to ensure high accuracy in differential amplification. Both the QDP1 and QDN1 are of an NMOS type, and each of them is formed in a P-type well (in a P-type substrate in the present preferred embodiment). The P-type well is supplied with the lowest potential (e.g., VDBL in the present preferred embodiment). Therefore, a relatively higher substrate bias is applied to the QDP1 having a larger potential, and the threshold voltage of the QDP1 becomes higher than that of the QDN1. In consequence, the QDN1 having a lower threshold voltage is more likely to turn on, causing the SAN to be driven first.

Figure 13:
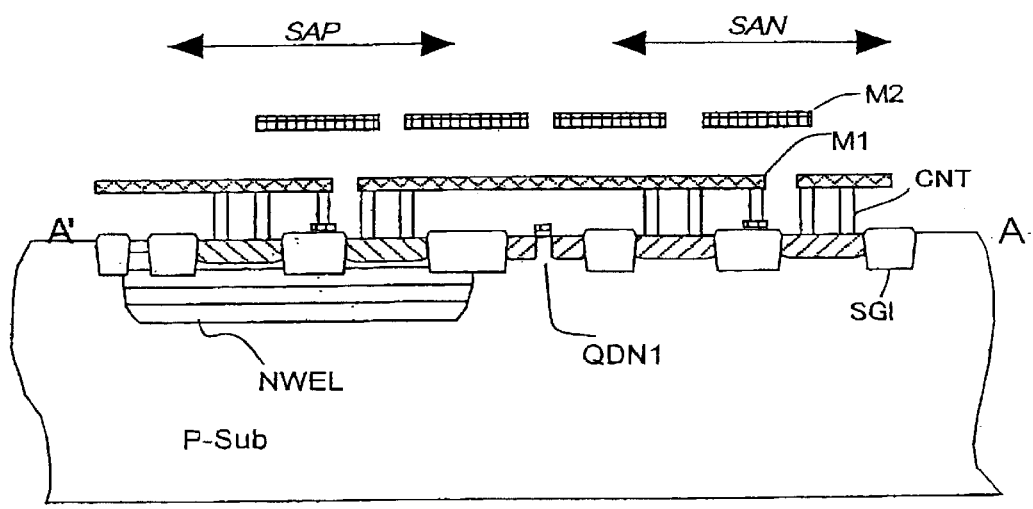
FIG. 13 is a diagram showing an example of a cross-sectional structure taken along line A–A' in the layout schemes of the sense amplifier circuits in FIGS. 12(a) and (b)
Figure 14:
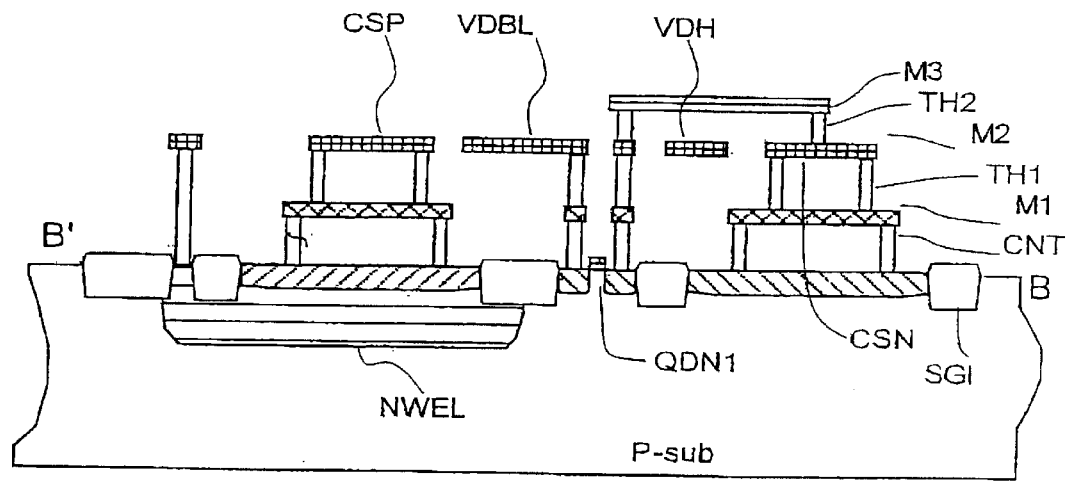
FIGS. 14(a) and (b) are diagrams showing examples of cross-sectional structures taken along line B–B' and line C–C' in the layout schemes of the sense amplifier circuits in FIGS. 12(a) and (b)
Figure 14:
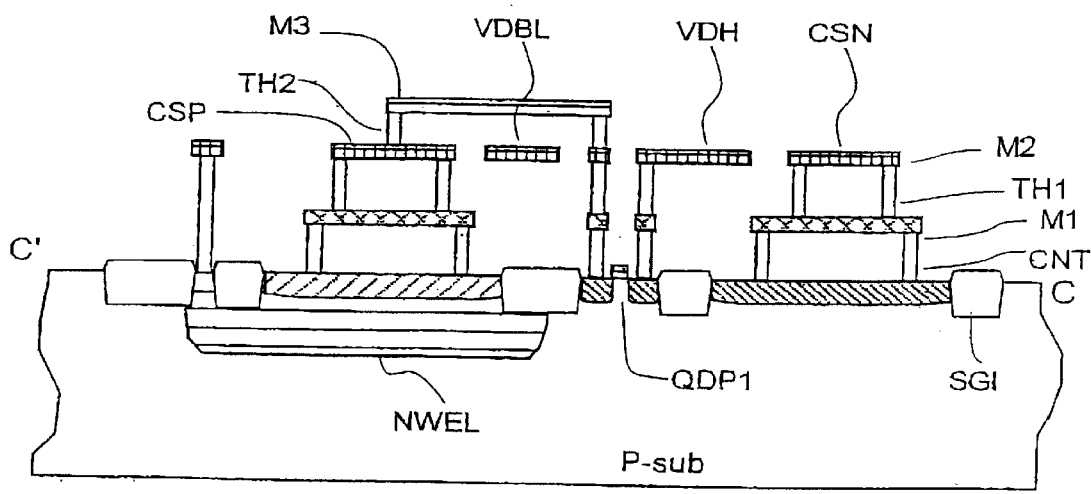

FIG. 13 shows a cross-sectional view taken along line A–A' in FIGS. 12(a) and (b), and FIGS. (a) and (b) show cross-sectional views taken along lines B–B' and C–C' respectively. In these cross-sectional views, a designation SGI (shallow groove isolation) indicates an insulating part for isolation of each diffusion layer (N+, P+ in the figures), which is formed by embedding a material such as Si oxide into a shallow groove in the substrate. A designation CNT indicates a contact hole for connection between the metal layer 1 (M1 in the figures) and the diffusion layer or FG. A designation TH1 indicates a contact hole for connection between the M1 and the metal layer 2 (M2 in the figures), and a designation TH2 indicates a contact hole for connection between the M2 and the metal layer 3 (M3 in figures) As shown in FIG. 14(a), the CSN and the drain of the QDN1 are connected through the M3. As can be seen from this figure, merely electrical connection may be arranged between the CSN and the drain of the QDN1. In the present preferred embodiment, the M3 is used for connection between the CSN and the drain of the QDN1 for the purpose of providing equal resistance between the drain of the QDN1 and each source of two NMOS elements constituting the SAN. The diffusion layer P+ is also connected so that the source potentials of the two NMOS elements constituting the SAN will be equal to each other. Thus, the circuit layout is designed to prevent an unbalanced condition between the two NMOS elements constituting the SAN. The CSN and CSP are formed in the M2 on the SAN and SAP, respectively. Similarly to each source of the two NMOS elements, as shown in FIG. 14(b), the CSP and the source of the QDP1(NMOS source of the QDP1) are connected through the M3. Each source of two PMOS elements constituting the SAP and the source of the QDP1 are also connected in a fashion similar to that mentioned above.

Figure 8:
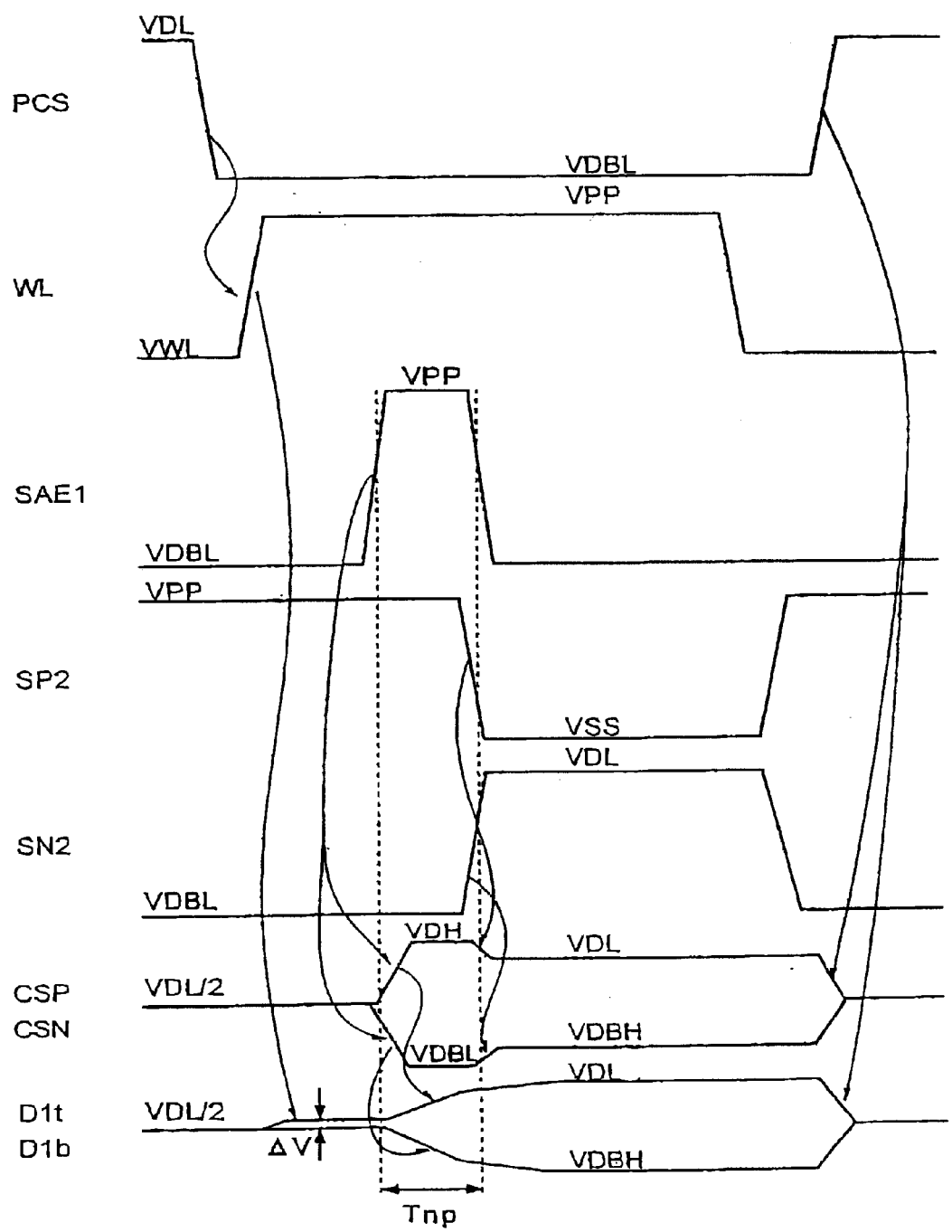
FIG. 8 is a diagram of operating waveforms in the fourth preferred embodiment of the present invention.

The following describes operations in the fourth preferred embodiment with reference to FIG. 8 which shows an operating waveform diagram. After completion of precharging of the data line, a minuscule voltage difference is produced on the data line in the same manner as that in the foregoing preferred embodiments. Data stored in each cell is read out onto the data line, and then the SAE1 is set from the VDBL to the VPP, thus activating the QDN1 and QDP1. Then, the CSN starts making a transition from the VDL/2 to the VDBL, and the CSP start making a transition from the VDL/2 to the VDH. At this point in time, the threshold voltage Vt of the QDP1 is higher than that of the QDN1 due to an effect of substrate biasing even where the QDP1 and QDP1 are structured using NMOS transistors having the same physical constant. Therefore, even if the same voltage is applied as a gate signal, the QDN1 is driven before the QDP1. To prevent an increase in current consumption which may result from an excessive amplitude of amplification on the data line, the QDN1 and QDP1 are made active by the SAE1 just for a period of time Tnp that a voltage on the low-level-side data line becomes less than the VDBH or a voltage on the high-level-side data line does not exceed the VDL. Since an over-driving period in the SAn is determined by the gate signal SAE1, the over-driving period in the SAn is equal to that in the SA1, i.e., it is equal to the Tnp. Thereafter, the SAE1 is set from the VPP to the VDBL to complete over-driving operation. At the same time that the SAE1 is set to the VDBL, the SN2 is set from the VDBL to the VDL or VPP to activate the QDN2. Thus, the CSN is set to the VDBH, and the low-level-side data line D1b is restored to the VDBH. Similarly, after the SAE1 is set to the VDBL, the SP2 is set from the VPP to the VSS to activate the QDP2. Thus, the CSP is set to the VDL, thereby restoring the high-level-side data line D1t to the VDL. Finally, the word line goes low for restoration to a precharge state in the same manner as in the foregoing preferred embodiments.

In the fourth preferred embodiment, the following advantageous effects are provided: (1) In the circuit layout, the QDP1 comprising an NMOS transistor is used, and the QDN1 and QDP1 are arranged in a single-row form on the sense amplifier area. Thus, the gate control signal can be used in common with the QDN1. As compared with the first, second and third preferred embodiments where the NMOS and PMOS transistors are provided, i.e., the NMOS and PMOS transistors are arranged in a two-row form, the single-row-form arrangement of the QDN1 and QDP1 requires a smaller space for the sense amplifier area. (2) Further, as compared with the circuit scheme shown in FIG. 3 where over-driving is performed on both the CSN and CSP, one over-driving control signal line can be eliminated in the fourth preferred embodiment, contributing to reduction in the size of the control signal circuit. (3) Since both the QDP1 and QDN1 comprising NMOS transistors are biased with the back gate using the same voltage, the QDN1 is driven before the QDP1 when the SAE1 signal is input at the start of sense operation. Therefore, differential amplification can be started using a minuscule voltage difference through the NMOS transistor which has smaller fluctuation in Vt due to process variation than the PMOS, thereby making it possible to ensure high accuracy in differential amplification. (4) Since the QDP1 of an NMOS transistor type is used, a gate-source voltage of the QDP1 becomes negative when the SAE1 signal is in the VDBL state. Therefore, while the QDP1 is inactive, it is possible to suppress current leakage from the VDH to the VDL/2. (5) As in the first, second and third preferred embodiments, an equal over-driving voltage and an equal over-driving period can be set for all the sense amplifiers SA, thereby allowing reduction in difference in sense operation with respect to far and near positions of the sense amplifiers arranged distributively.

While over-driving is performed on both P and N sides in the fourth preferred embodiment, the low-level restore potential VDBH may be used in lieu of the VDBL on the power line in the scheme shown in FIG. 8 in a case where over-driving on a single side satisfies requirements in terms of relationship with power supply voltage. This arrangement eliminates the need for providing a large-capacity negative power generator circuit for supplying the VDBL, thereby contributing advantageous reduction in chip area. Further, since the kinds of power lines for the sense amplifier circuit can be decreased consequently, there is provided an advantage that the meshed power line circuit is simplified.

In [Document 5], there is disclosed a circuit configuration in which NMOS transistors are used for high-level and low-level restore voltages to each CMOS sense amplifier in a DRAM. However, the circuit configuration disclosed in [Document 5] is based on the premise that a power voltage VCC is supplied as a word line drive voltage. On this premise, a threshold voltage Vt of each P-side switch NMOS is intentionally reduced to decrease the high-level restore voltage on a data line to a level of VCC-Vt. Therefore, the object of the circuit configuration disclosed in [Document 5] is different from that of the present invention. Further, [Document 5] gives no description to distributed arrangement of MOS switches and over-driving operation.

<Embodiment 5>

Referring to FIG. 9, there is shown a configuration of a sense amplifier circuit in a fifth preferred embodiment of the present invention. The fifth preferred embodiment is characterized in that the restore switches MOS of an NMOS type in FIG. 7 are distributively arranged in the sense amplifier area SAA, and in that the control signals are used in common in the same manner as in FIG. 7. The P-side and N-side over-driving switches NMOS QDP1 and QDN1 are structured as in FIG. 7. Unlike the circuit scheme shown in FIG. 7, the restore switches QDP2 and QDN2 are also distributively arranged in the sense amplifier area in the fifth preferred embodiment. The gates of the QDP2 and QDN2 are controlled through a common control line SAE2. Further, the high and low restore potentials, i.e., the VDL and VDBH are supplied through the meshed power line circuit described with reference to FIG. 24. One QDP2 and one QDN2 are provided per four sense amplifiers. The QDN1, QDP1, QDN2 and QDP2, which are NMOS transistors having two rows of gates, are disposed in a single-row form parallel to the SAN and SAP rows.

It is to be understood that the present invention is not limited to correspondence relationship among the number of sense amplifiers, the number of over-driving switches MOS, and the number of restore switches MOS used in the fifth preferred embodiment. For example, in a modified arrangement, each one of QDP1, QDP2, QDN1 and QDN2 may be provided per eight sense amplifiers. Further, since charging on the common source line is mainly performed by the over-driving switch, the restore switch may have a relatively small driving capacity. This arrangement is more rational than a configuration in which the number of over-driving switches QDP1 and QDN1 is larger than the number of switches QDP2 and QDN2. That is to say, in general, there may be provided such an arrangement that conductance of all the over-driving switches MOS is higher than that of all the restore switches MOS.

Figure 10:
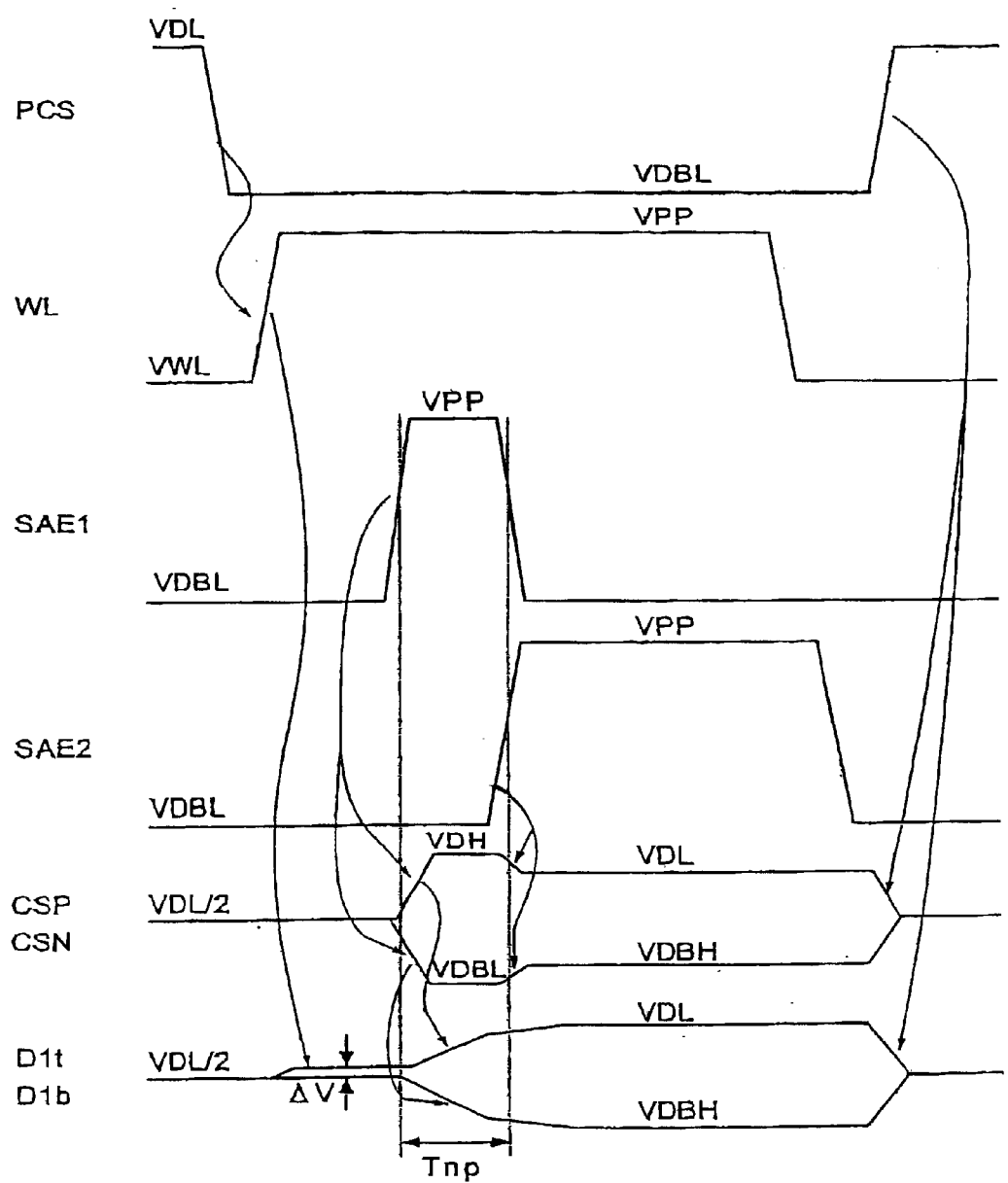
FIG. 10 is a diagram of operating waveforms in the fifth preferred embodiment of the present invention.

The following describes operations in the fifth preferred embodiment with reference to FIG. 10 which shows an operating waveform diagram. After completion of precharging, the SAE1 is set to the VPP to start over-driving in the same manner as in FIG. 8. To prevent an increase in current consumption due to excessive sensing, the QDN1 and QDP1 are made active by the SAE1 just for a period of time Tnp that a voltage on the low-level-side data line becomes less than the VDBH or a voltage on the high-level-side data line does not exceed the BDL. Since an over-driving period in the SAn is determine by the gate signal SAE1, the over-driving period in the SAn is equal to that in the SA1, i.e., it is equal to the Tnp. Thereafter, the SAE2 is set from the VDBL to the VPP, the CSN is set to the VDBH, and the low-level-side data line D1b is restored to the VDBH. At the same time, the CSP is set to the VDL, and the high-level-side data line D1t is restored to the VDL. For the SAE2, the QDN1, QDN2, QDP1 and QDP2 are activated simultaneously, and the power potentials VDBL, VDBH, VDH and VDL are controlled not to incur short-circuiting through the CSN and CSP.

In the fifth preferred embodiment, the following advantageous effects are provided: (1) In the sense amplifier circuit layout, the sense drivers of an NMOS type are arranged in a two-row form. Although this results in an increase in the size of the sense amplifier layout area in comparison with the fourth preferred embodiment, there is no need for providing the sense drivers in other than the sense amplifier area. Therefore, the circuit layouts of other than the sense amplifier area can be simplified. (2) As compared with the second preferred embodiment in which over-driving is performed on both the high-level-side and low-level-side data lines, the number of sense amplifier control signals can be decreased by two signals. This leads to reduction in the size of the control signal circuit. (3) As in the first to fourth preferred embodiments, an equal over-driving voltage and an equal over-driving period can be set for all the sense amplifiers SA, thereby allowing reduction in difference in sense operation with respect to far and near positions of the sense amplifiers arranged distributively. (4) Since the QDP1 and QDP2 of an NMOS transistor type are used, a gate-source voltage VGS of each of the QDP1 and QDP2 becomes less than 0 V (VGS<0V) in a standby state. Therefore, current leakage from the VDH and VDL to the VDL/2 can be suppressed.

There may also be provided such a modified arrangement that the VDBL is equal to the VDBH though the degree of improvement in sense operation speed is decreased. This arrangement eliminates the need for providing a large-capacity negative power supply circuit, thereby contributing advantageous reduction in chip area. Further, since just three kinds of power lines are required for the sense amplifiers, the power line circuit on the memory array can be simplified advantageously.

Figure 11:
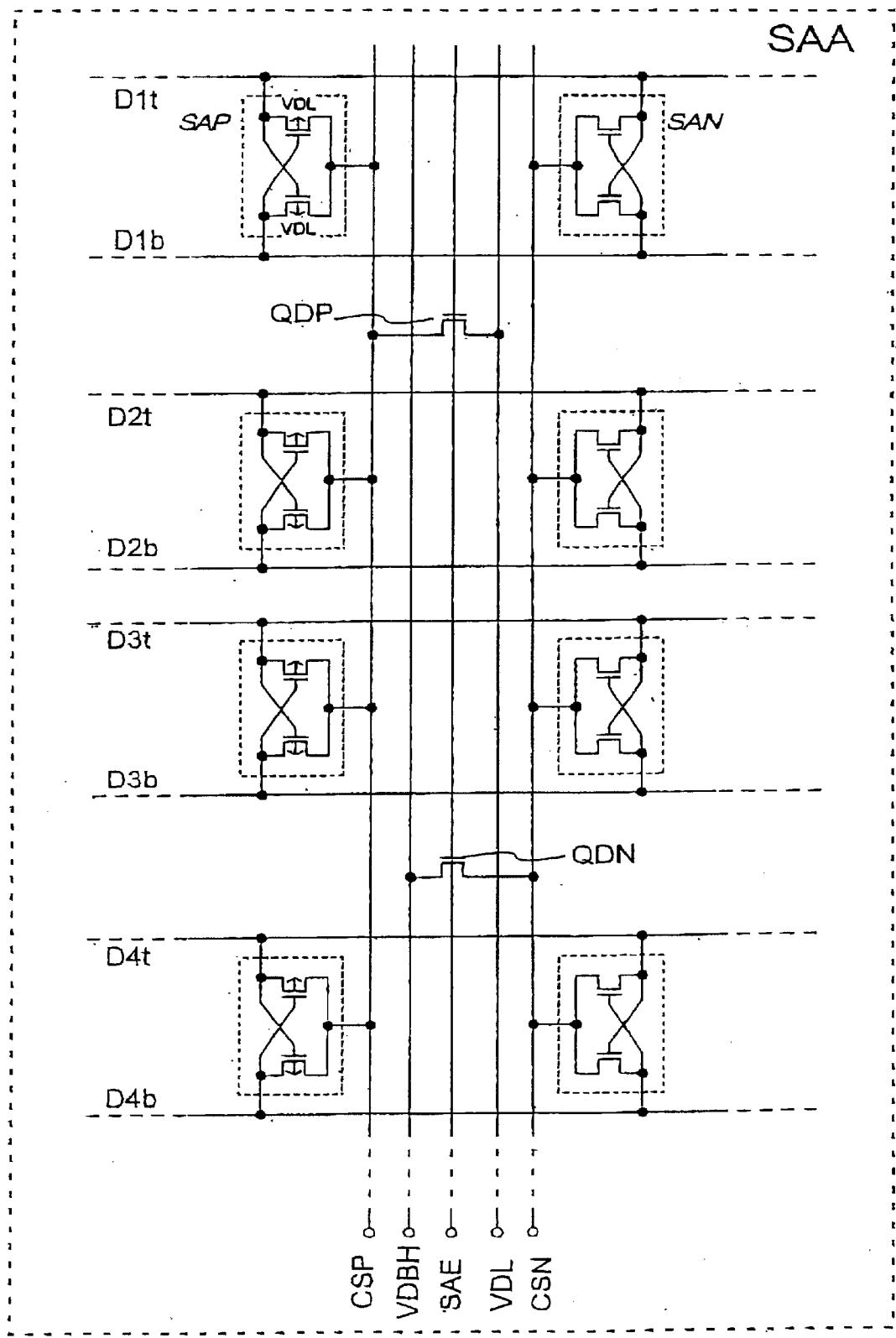
FIG. 11 is a diagram showing a preferred embodiment in an application of the present invention to an ordinary sense operation method.

The present invention is also applicable to a sense amplifier configuration without using an over-driving scheme. FIG. 11 shows a preferred embodiment in an application of the present invention to an ordinary sense operation method. Since over-driving is not used in this sense amplifier configuration, a PMOS-to-SAP substrate potential is set at the VDL for each sense amplifier. Further, there is no need for providing the sense drivers in other than the sense amplifier area. Therefore, the circuit layouts of other than the sense amplifier area can be simplified advantageously.

While all the sense amplifiers in FIGS. 7 to 11 comprise NMOS transistors, there may be provided such a modification that PMOS transistors are used as the sense amplifiers.

In the preferred embodiments mentioned above, either low or high Vt may be employed for the sense drivers and SA transistors. Where low-Vt transistors are used, sense amplifier operation can be performed at higher speed than that in the use of high-Vt transistors. Where the high-Vt transistors are used, current leakage in an SA data holding state can be reduced to decrease power consumption. In contrast, where the low-Vt transistors are used, it is possible to reduce current leakage by the method to be described later. Further, by using the high-Vt transistors as the sense drivers, current leakage between the sense amplifier power supply and the VDL/2 can be reduced in a standby state.

In the first to fifth preferred embodiments, it is preferable to provide the following voltage relationship. As to VWL and VPP in amplitude on word line WL, VDBH and VDL in amplitude on data line, VDBL and VDH used as power voltages for initial sense operation, and substrate potential VBB, the voltage relationship indicated below may be set up for decreasing the number of internal power sources:

$$VBB=VDBL(-0.75\ V)<VWL=VDBH=VSS(0\ V)<VDL(1.5\ V)<VDH(2.5\ V)<VPP(3\ V)$$

Under condition that VBB<VDBL (−0.5 V), variation in memory cell substrate bias can be suppressed advantageously though the number of power sources is increased. Further, under condition that VDH=VPP (3 V), each sense amplifier can be activated with higher power supply.

For power voltage-setting, a negative word method in which a word-line standby voltage level is negative may be employed as reported in [Document 6]. For applying the negative word method to the preferred embodiments mentioned above, it is required to provide the following condition:

$$VBB=VDBL=VWL(-0.75\ V)<VDBH=VSS(0\ V)<VDL(1.5\ V)<VDH=VPP(2.25\ V)$$

The use of the negative word method provides an advantageous effect that the number of internal power supply levels can be reduced. Further, under condition that VBB<VDBL<VWL, VBB<VWL<VDBL, or VBB<VDBL=VWL in an arrangement that VBB is provided separately from other power sources, variation in VBB used as a memory cell array substrate bias can be suppressed though the number of power supply levels is increased. Thus, the data holding characteristic of each cell can be improved advantageously.

In the schemes described above, it is preferable to use an external power voltage VCC as the VDH. In a modified arrangement, a voltage level stepped up by a voltage boosting circuit or a voltage level stepped down by a voltage down-converter circuit may be used as the VDH.

<Embodiment 6>

While the over-driving methods have been discussed in the foregoing preferred embodiments, it is considered that reduction in threshold voltage Vt for each sense amplifier is required in a situation where the power supply voltage is decreased. By over-driving each sense amplifier comprising a low-threshold-voltage MOS transistor, the amplitude on an operable data line could be further decreased for reduction in power consumption. However, since the use of a low-threshold-voltage MOS transistor increases a sub-threshold current to result in an increase in current consumption in a waiting state, there would occur a problem in consistency with an active-standby state in the SDRAM. Therefore, a method for reducing a sub-threshold current under condition that data is latched by the sense amplifier comprising a low-threshold-voltage MOS transistor is disclosed herein as a fifth preferred embodiment.

Figure 20:
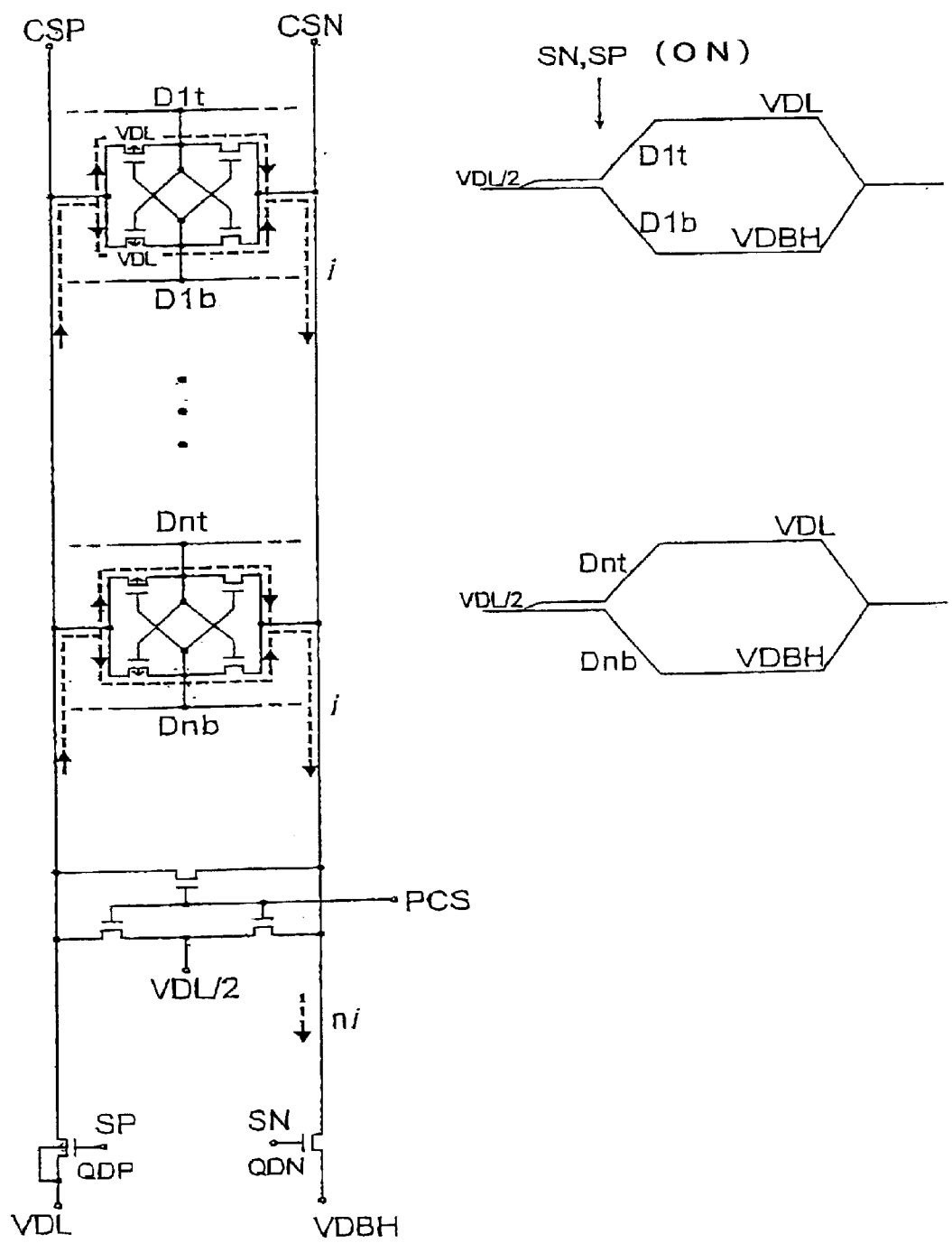
FIG. 20 is a diagram showing leak current paths in an active-standby state.
Figure 21:
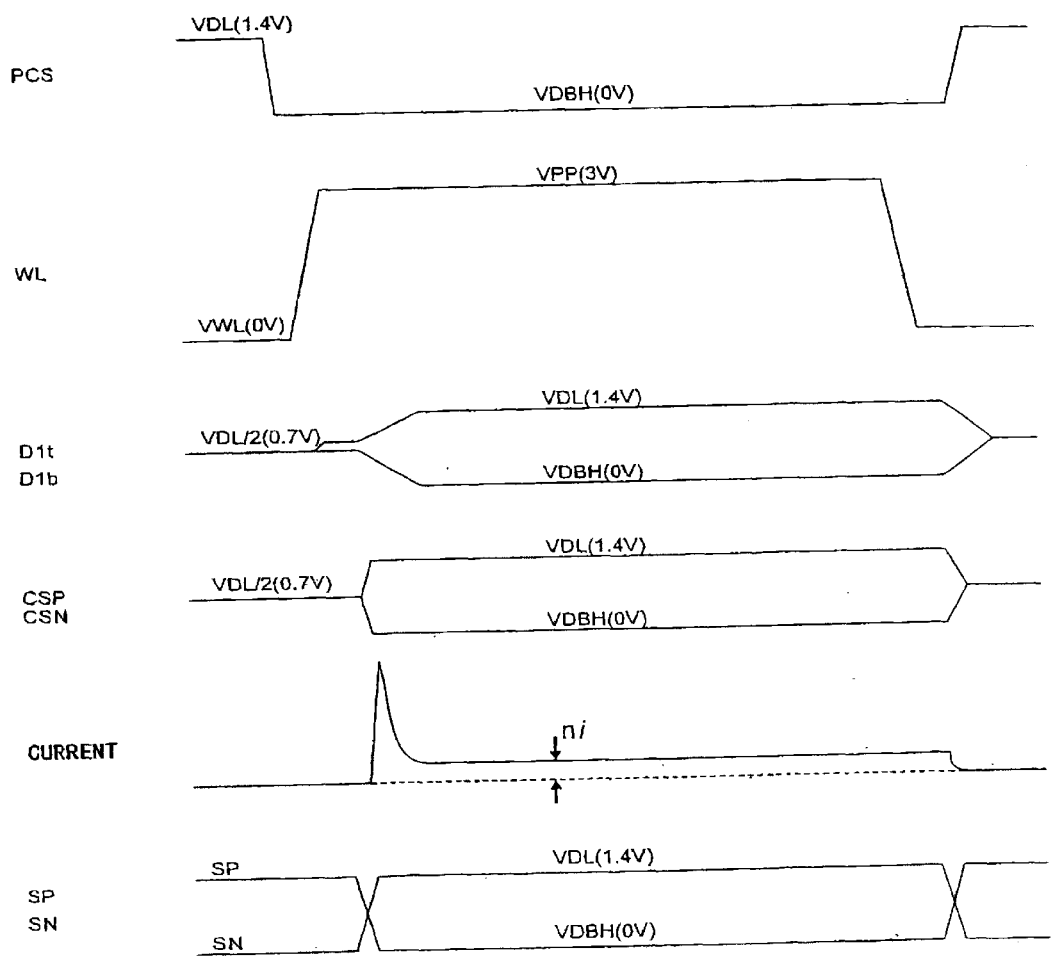
FIG. 21 is a diagram of operating waveforms in connection with FIG. 20.

Referring to FIG. 20, there is shown a sub-threshold current of the sense amplifier when a signal from each data line is amplified and latched by the sense amplifier. In the SDRAM, a particular word of memory cell data is amplified and latched by the sense amplifier using a low-active command. This operating condition is referred to as an active-standby state. In the active-standby state, data is held by the sense amplifier in advance for realizing high-speed access. As shown in FIG. 20, under condition that data is held by each sense amplifier, a sub-threshold current "i" flows per sense amplifier. As to the sense amplifier CMOS connected in series between the VDL and VDBH, either PMOS or NMOS transistor has a gate-source voltage of 0 V in an OFF state. However, if the threshold voltage is low, a complete OFF state is not set to produce a flow of sub-threshold current to be considered. Therefore, as shown in the waveform diagram in FIG. 21, a leak current "ni" is fed from the power supply VDL to the VDBH resultantly. In an instance where 64 k sense amplifiers comprising transistors having a threshold voltage Vt of 0.1 V are set to the active-standby state, a sub-threshold current of approximately 3 mA is fed to prevent reduction in power consumption. Further, in an instance where the threshold voltage Vt of each transistor is decreased by 0.1 V, the sub-threshold current is increased approximately ten times. Therefore, in a case where there is variation in threshold voltage Vt among fabricated transistors or in an application where the transistors are used at a high temperature level that the threshold voltage Vt tends to decrease, the sub-threshold current in low-Vt MOS gives rise to a considerable problem.

Figure 15:
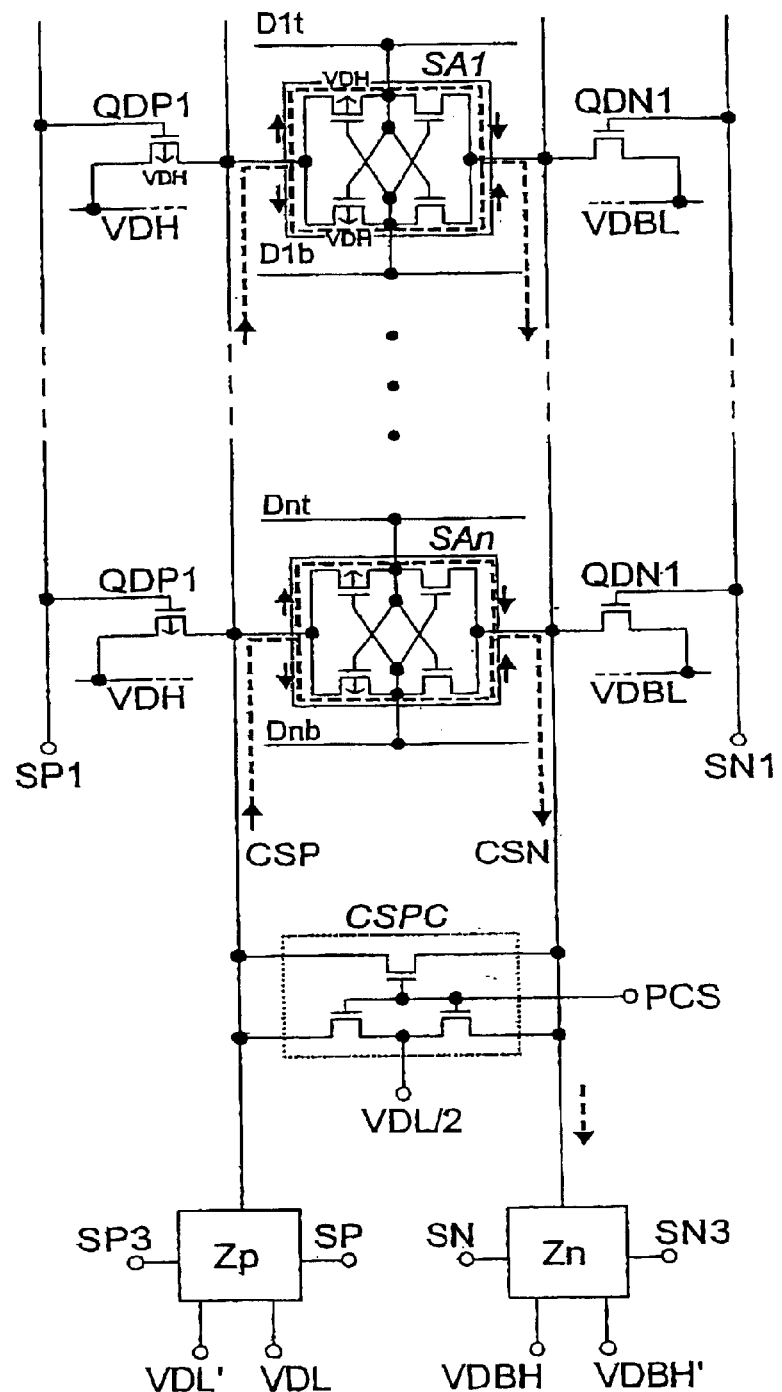
FIG. 15 is a diagram showing a sense amplifier circuit in a sixth preferred embodiment of the present invention.

Referring to FIG. 15, there is shown a circuit scheme in which a method of sub-threshold current reduction in the active-standby state is applied to the over-driving SA configuration according to the present invention. The sixth preferred embodiment is based on the foregoing preferred embodiments, and a similar circuit structure is used therein. The circuit scheme shown in FIG. 15 will be easier to understand through examination in comparison with that in FIG. 3 in particular.

First, the following explains a principle of leak current reduction in a sense amplifier. After cell data is amplified by the sense amplifier SA, the CSN is set at the VDBH and the CSP is set at the VDL. At this step, a value of MOS substrate bias contained in the SA is equal to a design value, e.g., in an NMOS transistor, the substrate bias has a value of VBB. Then, when the CSN makes a level transition from the VDBH to VDBH' (>VDBH), the substrate bias is increased by (VDBH'−VDBH). Thus, the effect of the substrate bias increases the threshold voltage Vt of the NMOS transistor. More specifically, under condition that the gate and source of the NMOS transistor are short-circuited, a constant voltage (substrate voltage) is applied to the back gate and a source potential (=gate potential) is made higher. Thus, since a voltage between the back gate and source becomes higher to result in a relatively higher bias to the back gate, the threshold value of the NMOS transistor is increased. Similarly, when the CSP makes a level transition from the VDL to VDL' (<VDL), the threshold voltage Vt of the PMOS transistor is increased. Thus, the threshold voltages Vt of the NMOS and PMOS transistors are increased through level transitions on the CSN and CSP. Therefore, the sub-threshold leak current which determines a degree of SA current leakage can be decreased for reduction in leak current from the VDL to VDBH. For attaining the above advantageous effect, the sixth preferred embodiment is characterized in that there is provided means for changing the levels of the common sources CSN and CSP among the standby state, active state, and active-standby state.

In lieu of the P-side and N-side restore switches indicated in FIG. 3, Zp and Zn are used in the circuit scheme shown in FIG. 15. The Zp and Zn are means for supplying P-side and N-side restore potentials and for changing these restore potentials according to control signals. As an example, the function of the Zn in operation is mentioned below. In the initial amplification period of sense amplifier operation, over-driving of the CSN is performed by the QDN1 using the VDBL. After the over-driving is stopped, the Zn supplies a restore potential VDBH to the CSN according to an SN control signal. Then, after a lapse of a predetermined period of time, the active-standby state is set up. In this state, the Zn drives the CSN to the VDBH' (>VDBH) according to an SN3 control signal.

Referring then to FIGS. 16(a) to (d), there are shown examples of arrangements of the Zn indicated in FIG. 15. In the Zn arrangement shown in FIG. 16(a), a high-Vt NMOS QDN3 switch is added between the CSN and VDBH in parallel with the QDN. The QDN3 comprises a low-drive-power transistor having a gate length-to-width ratio W/L of 1/500 or less of that of the QDN. When the QDN3 is activated, the QDN3 supplies the VDBH' (>VDBH) to the CSN. More specifically, the SN3 provides a high impedance even when it is put into conduction, and a voltage drop takes place when a leak current of the sense amplifier is fed. Therefore, the CSN is set to the VDBH' for reducing leakage by a negative feedback effect. The substrate potential of the QDN3 is set to a level equal to that of the QDN. Under condition that the sense amplifier is active, the QDN3 is activated when at least the QDN is inactive. The QDN3 may be activated simultaneously with the QDN in the initial period of sense operation. For activating the QDN3, the SN3 is set from the VDBH to the VDL.

Figure 16:
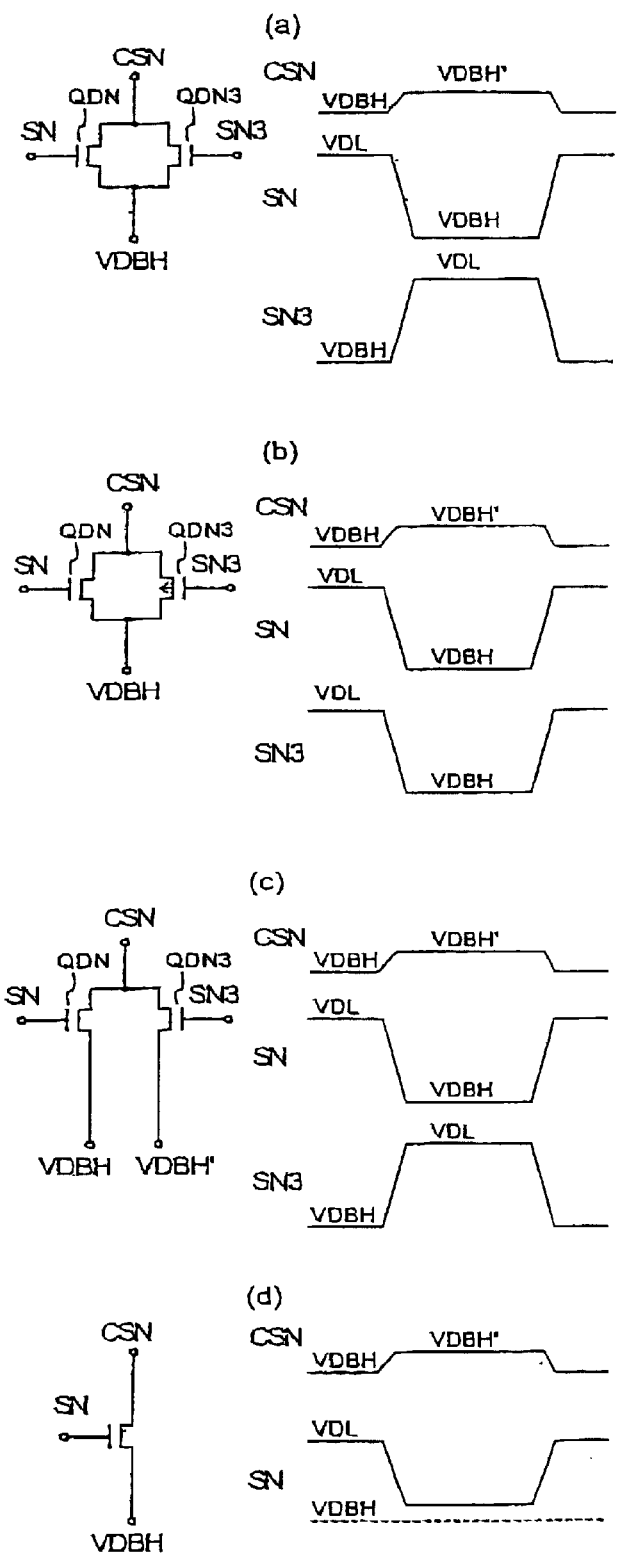
FIGS. 16(a) to (d) are diagrams showing examples of arrangements of Zn indicated in FIG. 15.

In the Zn arrangement shown in FIG. 16(b), a low-VT PMOS QDN3 switch is added between the CSN and VDBH in parallel with the QDN. When activated by a gate signal SN3, the QDN3 supplies the CSN with a power voltage which is higher than the VDBH by the amount of Vt of the QDN3. The substrate potential of the QDN3 is set to a level equal to the VDL or a level equal to a potential at the PMOS of the SA. Under condition that the sense amplifier is active, the QDN3 is activated when at least the QDN is inactive. For activating the QDN3, the SN3 is set from the VDL to the VDBH.

In the Zn arrangement shown in FIG. 16(c), a high-Vt NMOS QDN3 switch using the VDBH' as a power voltage is connected to the CSN. Therefore, this circuit scheme is based on the premise that a VDBH' (>VDBH) power supply circuit is formed. The VDBH' power supply circuit comprises such element circuits as a resistance divider circuit and a voltage limiter circuit. The substrate potential of the QDN2 is set to a level equal to the substrate potential of the QDN. When the QDN3 is activated by the SN3, the QDN3 supplies the VDBH' to the CSN. Under condition that the sense amplifier is active, the QDN3 is activated when the QDN is inactive. For activating the QDN3, the SN3 is set from the VDL to the VDBH.

In the Zn arrangement shown in FIG. 16(d), a gate voltage of the QDN is controlled by the SN, i.e., the effect of the Zn is realized using the QDN. Through control of the gate signal SN3, an ON resistance of the QDN is increased in the active-standby state for setting a CSN level to the VDBH'. In the circuit scheme shown in FIG. 16(c), since no additional transistor is provided, SN control operation becomes more complex than in the other examples of Zn arrangements. However, the circuit scheme in FIG. 16(c) is advantageous in that the peripheral circuit layout of the sense amplifier can be simplified.

Referring to FIGS. 17(a) to (d), there are shown examples of arrangements of the Zp. Based on FIGS. 16(a) to (d), these circuit schemes are modifications for P-side high level operation. The circuit schemes shown in FIGS. 17(a) to (d) will be understood as in the above description of those shown in FIGS. 16(a) to (d).

Figure 17:
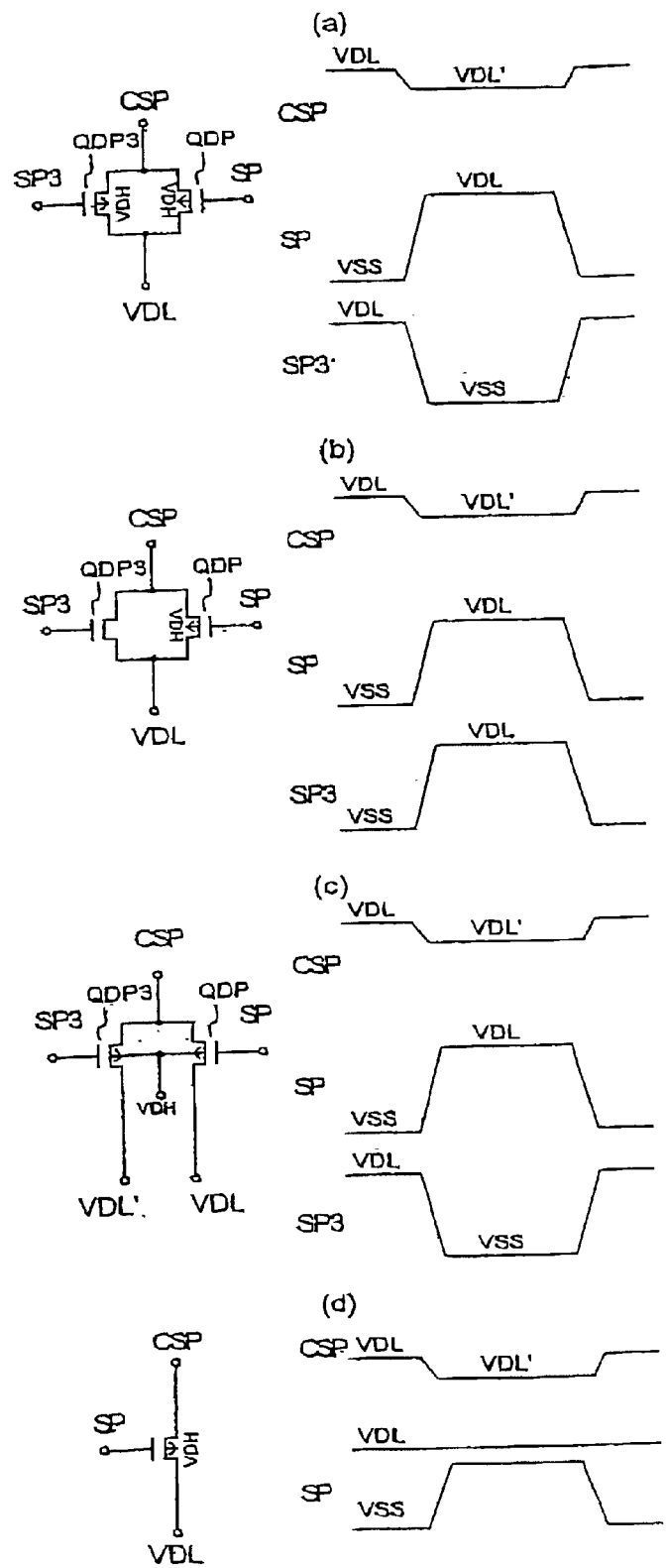
FIGS. 17(a) to (d) are diagrams showing examples of arrangements of Zp indicated in FIG. 15.
Figure 18:
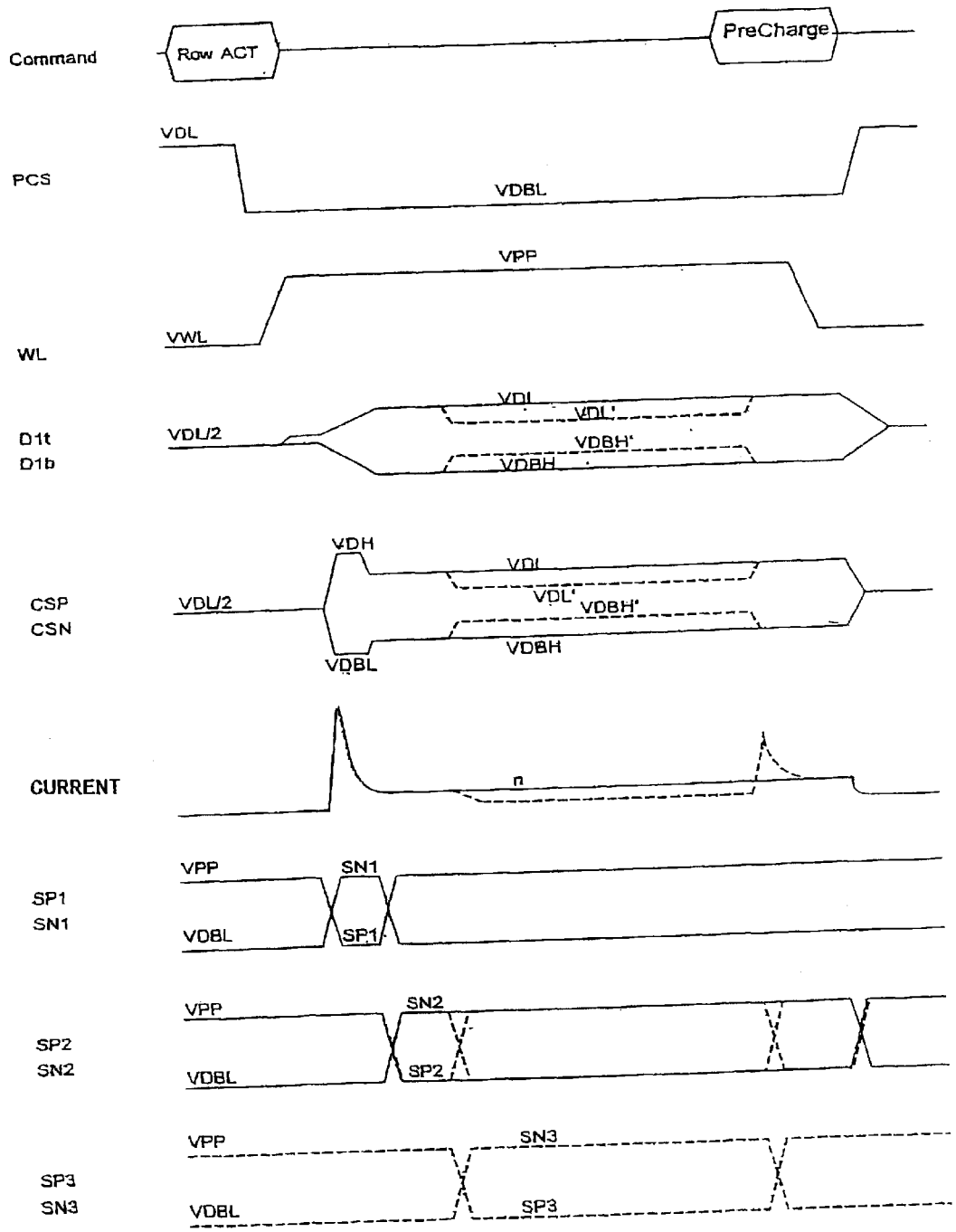
FIG. 18 is a diagram of operating waveforms in an application where the Zn and Zp arrangements shown in FIG. 16(c) and FIG. 17(c) are used in the sense amplifier circuit in FIG. 15.

FIG. 18 shows operating waveforms in an application where the Zn and Zp arrangements shown in FIG. 16(c) and FIG. 17(c) are used in the sense amplifier circuit in FIG. 15. After input of a low-active command, the PCS makes a transition from the VDL to the VDBH, and the precharge operation is stopped. The operational sequence to be taken after completion of the precharge until data is held in the sense amplifier is the same as that described in Embodiment 2. Therefore, this operational sequence is not described here. Under condition that data has been established after completion of amplification through over-driving and restore operations in the SA, a leak current is fed between the VDL and VDBH as mentioned in the foregoing. In a situation where a leak current "i" is fed per sense amplifier and "n" sample amplifiers are connected to the common source line in the sub-memory array, the sum total of current leakage from the VDL to the VDBH is "ni".

For reduction in current leakage, after a certain lapse of the low-active signal, the sense amplifier amplifies a cell read-out signal-to a sufficient level. Then, the SN and SP are deactivated, and the SN3 and SP3 are activated instead thereof. As a result, the CSN is set from the VDBH to the VDBH', and the CSP is set from the VDL to the VDL'. At this step, the substrate potential of the NMOS transistor constituting the SA becomes relatively higher by (VDBH'−VDBH), and the substrate potential of the PMOS transistor also becomes relatively higher by (VDL−VDL') Through an effect of substrate biasing, the NMOS and PMOS transistors become to provide high Vt, thereby making it possible to decrease a sub-threshold leak current.

A minimum design value of amplitude (VDL'−VDBH) on a pair of data lines in the active-standby state is determined according to sensitivity of the sense amplifier. On the assumption that the data line amplitude is 1.4 V, it is preferable to set the data line pair to approximately 600 mV. Under this setting condition, even if a read command is applied, data is not destroyed to allow reduction in current leakage in the active-standby state.

The following describes operations to be performed after input of a precharge command for terminating the active-standby state. On input of the precharge command, the SN3 and SP3 are deactivated, and the SN and SP are activated, thereby rewriting the data line pair to have the VDBH or VDL. Then, the word line is deactivated to be set from the VPP to the VWL, and the SN and SP are deactivated.

Finally, using the PCS, the data line pairs CSN and CSP are precharged to a precharge level VDL/2.

According to the present invention, it is also possible to attain an advantageous effect of reduction in current leakage on a precharge circuit and a column switch comprising a low-Vt MOS transistor. In the active-standby state, the precharge control signal PCS and Y select signals YS0 and YS1 are at any one of levels VDBH, VSS and VDBL. Where the NMOS substrate potential in the sense amplifier is used in common, an effect of substrate biasing is provided on an NMOS transistor connected in series between the data lines included in the precharge circuit PC, thereby increasing the Vt and applying a negative gate-source voltage. Thus, current leakage on the precharge circuit can be reduced. This makes it possible to reduce current leakage between the VDL and VDBH. Similarly, by supplying the VDL/2 contained in the precharge circuit PC, it is possible to reduce current leakage from the VDL/2 to the VDBH on the NMOS transistor connected with the low-level-side data line. Further, in a situation where the I/O line pair precharge level is equal to or higher than the data line pair potential, current leakage on the NMOS transistor connected with the I/O line and low-level-side data line can also be reduced.

It is to be understood that the present invention is not limited in its application to a particular method of activating the CSN and CSP and a particular arrangement of MOS transistors to be activated for activation of the sense amplifier. The present invention is also applicable to an SA structure having a cross-coupled circuit configuration. For instance, for reduction in power consumption, the present invention is applicable to non-over-driving sense amplification as well as over-driving amplification exemplified in Embodiments 1 to 5.

Figure 19:
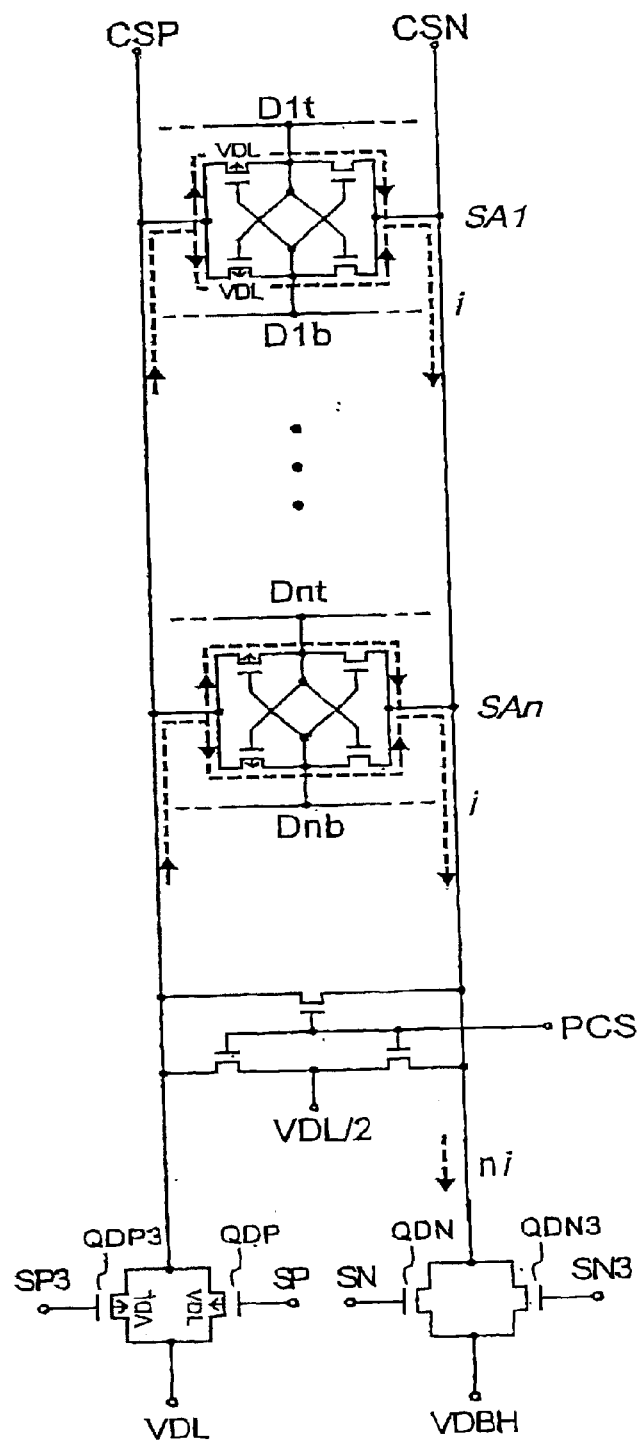
FIG. 19 is a diagram showing an example of a circuit arrangement in an application to a low-Vt sense amplifier.

FIG. 19 shows an example in which the present invention is implemented in a sense amplifier circuit of a non-over-driving type. In the circuit arrangement shown in FIG. 19, it is preferable to set the PMOS pair substrate potential of the sense amplifier to the VDL. The QDP and QDP3 substrate potentials are also preferably set to the VDL.

INDUSTRIAL APPLICABILITY

Briefly described below are the advantageous effects to be attained in representative embodiments disclosed in the present invention. According to the present invention, in an over-driving sense amplifier circuit, a plurality of over-driving sense drivers are distributively arranged in the sense amplifier circuit, thereby making it possible to decrease a difference in common-source potential among a plurality of the sense amplifiers in sense operation. Further, for all the sense amplifiers, an over-driving period can be controlled using a gate signal, which provides an advantage that a difference in sense operation with respect to far and near positions of the sense amplifiers can be reduced. Consequently, while ensuring high-speed sense operation, the present invention is capable of suppressing power consumption for implementation of a low-power-consumption circuit.

What is claimed is:

1. A semiconductor device comprising:

a plurality of word lines, a plurality of data lines, and a plurality of DRAM memory cells;

a plurality of sense amplifiers coupled to said plurality of data lines and each receiving operating voltage from first and second nodes;

a first line connected to said first nodes;

a second line connected to said second nodes;

first drive means for coupling said first line with a first potential; and second drive means for coupling said second line with a second potential;

wherein each of said plurality of sense amplifiers includes a first NMISFET pair arranged in a cross-coupled form and a second PMISFET pair arranged in a cross-coupled form, wherein said first drive means sets up a connection between the first potential and said first line at a first impedance in a first operation mode and a connection between the first potential and said first line at a second impedance higher than the first impedance in a second operation mode, wherein said second drive means sets up a connection between the second potential and said second line at a third impedance in the first operation mode and a connection between the second potential and said second line at a fourth impedance higher than the third impedance in the second operation mode, wherein said first drive means includes a first NMISFET and a first PMISFET disposed in parallel between said first line and the first potential, and wherein said second drive means includes a second NMISFET and a second PMISFET disposed in parallel between said second line and the second potential.

2. The semiconductor device according to claim 1, wherein a change from the first operation mode to the second operation mode occurs after a first time from a row active command.

3. The semiconductor device according to claim 2, wherein the second operation mode ends when a precharge command is issued.

4. A semiconductor device comprising:

a plurality of word lines, a plurality of data lines, and a plurality of DRAM memory cells;

a plurality of sense amplifiers coupled to said plurality of data lines and each receiving operating voltage from first and second nodes;

a first line connected to said first nodes;

a second line connected to said second nodes;

first drive means for coupling said first line with a first potential; and second drive means for coupling said second line with a second potential;

wherein each of said plurality of sense amplifiers includes a first NMISFET pair arranged in a cross-coupled form and a second PMISFET pair arranged in a cross-coupled form, wherein said first drive means sets up a connection between the first potential and said first line at a first impedance in a first operation mode and a connection between the first potential and said first line at a second impedance higher than the first impedance in a second operation mode, wherein said second drive means sets up a connection between the second potential and said second line at a third impedance in the first operation mode and a connection between the second potential and said second line at a fourth impedance higher than the third impedance in the second operation mode, wherein said first drive means includes a first PMISFET having its source/drain path between said first line and the first potential;

wherein said second drive means includes a first NMISFET having its source/drain path between said second line and the second potential, wherein the gate voltage of said first PMISFET in said second operation is controlled between the gate voltage of said first PMISFET in said first operation and said first potential, and wherein the gate voltage of said first NMISFET in said second operation is controlled between the gate voltage of said first NMISFET in said first operation and said second potential.

5. The semiconductor device according to claim 4, wherein a change from the first operation mode to the second operation mode occurs after a first time from a row active command.

6. The semiconductor device according to claim 5, wherein the second operation mode ends when a precharge command is issued.

* * * * *

UNITED STATES PATENT AND TRADEMARK OFFICE
CERTIFICATE OF CORRECTION

PATENT NO. : 6,717,835 B2 Page 1 of 1
APPLICATION NO. : 10/347804
DATED : April 6, 2004
INVENTOR(S) : Riichiro Takemura et al.

It is certified that error appears in the above-identified patent and that said Letters Patent is hereby corrected as shown below:

On the Title Page

In item (73), the Assignee should read as follows:

(73) Assignee: Renesas Technology Corp., Tokyo (JP)

Signed and Sealed this

Third Day of February, 2009

JOHN DOLL
*Acting Director of the United States Patent and Trademark Office*